United States Patent
Lee et al.

(10) Patent No.: US 11,569,317 B2
(45) Date of Patent: Jan. 31, 2023

(54) ORGANIC LIGHT-EMITTING DISPLAY APPARATUS AND METHOD OF MANUFACTURING THE SAME

(71) Applicant: SAMSUNG DISPLAY CO., LTD., Yongin-si (KR)

(72) Inventors: Duckjung Lee, Yongin-si (KR); Hyejin Gwark, Yongin-si (KR); Arong Kim, Yongin-si (KR); Jungsun Park, Yongin-si (KR); Hyunsung Bang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 52 days.

(21) Appl. No.: 17/332,870

(22) Filed: May 27, 2021

(65) Prior Publication Data

US 2021/0296416 A1    Sep. 23, 2021

Related U.S. Application Data

(62) Division of application No. 16/239,085, filed on Jan. 3, 2019, now Pat. No. 11,049,916.

(30) Foreign Application Priority Data

Jan. 29, 2018 (KR) .................. 10-2018-0010846

(51) Int. Cl.
*H01L 51/40* (2006.01)
*H01L 27/32* (2006.01)
(Continued)

(52) U.S. Cl.
CPC ...... *H01L 27/3246* (2013.01); *H01L 27/3279* (2013.01); *H01L 51/5209* (2013.01);
(Continued)

(58) Field of Classification Search
CPC ..................... H01L 27/3246; H01L 51/40
See application file for complete search history.

(56) References Cited

U.S. PATENT DOCUMENTS 7,834,543 B2    11/2010  Takata
7,902,746 B2     3/2011  Park
(Continued)

FOREIGN PATENT DOCUMENTS

CN        102655219 A       9/2012
EP        2 744 008 A1      6/2014
(Continued)

OTHER PUBLICATIONS

Extended European Search Report for corresponding European Patent Application No. 19152186.3, dated Jun. 3, 2019, 6 pages.

*Primary Examiner* — Caleb E Henry
(74) *Attorney, Agent, or Firm* — Lewis Roca Rothgerber Christie LLP

(57) ABSTRACT

An organic light-emitting display apparatus, including a substrate including a plurality of pixel areas and non-pixel areas in a display area, a plurality of pixel electrodes respectively corresponding to the plurality of pixel areas, a pixel-defining layer including a cover portion and openings, wherein the cover portion covers an edge of each of the plurality of pixel electrodes, and each of the openings exposes a central portion of a pixel electrode among the plurality of pixel electrodes, an auxiliary electrode located such that the auxiliary electrode corresponds to at least a portion of a top surface of the cover portion, and an intermediate layer and a counter electrode, each located in the openings. The pixel-defining layer may have an undercut structure in which the at least a portion of the top surface of the cover portion is recessed from the auxiliary electrode.

10 Claims, 18 Drawing Sheets

(51) Int. Cl.
*H01L 51/52* (2006.01)
*H01L 51/56* (2006.01)
*H01L 51/50* (2006.01)

(52) U.S. Cl.
CPC ...... *H01L 51/5225* (2013.01); *H01L 51/5228* (2013.01); *H01L 51/56* (2013.01); *H01L 51/5056* (2013.01); *H01L 51/5088* (2013.01); *H01L 2227/323* (2013.01)

(56) References Cited

U.S. PATENT DOCUMENTS

| | | | |
|---|---|---|---|
| 7,928,431 B2 | 4/2011 | Choe et al. | |
| 8,362,469 B2 | 1/2013 | Suh | |
| 8,957,413 B2 | 2/2015 | Song et al. | |
| 9,257,672 B2 | 2/2016 | Yoon et al. | |
| 9,401,390 B2 | 7/2016 | Song et al. | |
| 9,530,980 B2 | 12/2016 | Oh et al. | |
| 9,647,241 B2 * | 5/2017 | Lee | H01L 51/5278 |
| 9,679,952 B2 | 6/2017 | Miyazawa | |
| 10,186,680 B2 * | 1/2019 | Lee | H01L 51/5056 |
| 10,205,117 B2 * | 2/2019 | Song | H01L 27/3248 |
| 10,686,022 B2 * | 6/2020 | Lee | H01L 27/3246 |
| 2005/0116620 A1 | 6/2005 | Kobayashi | |
| 2007/0064486 A1 | 3/2007 | Sung et al. | |
| 2008/0100209 A1 | 5/2008 | Ito | |
| 2014/0332779 A1 | 11/2014 | Lin | |
| 2014/0353633 A1 | 12/2014 | Lee et al. | |
| 2015/0044801 A1 | 2/2015 | Lee et al. | |
| 2016/0035803 A1 | 2/2016 | Kim et al. | |
| 2016/0043341 A1 | 2/2016 | Heo et al. | |
| 2016/0203765 A1 | 7/2016 | Lee | |
| 2016/0240810 A1 | 8/2016 | Oh et al. | |
| 2017/0125506 A1 | 5/2017 | Kim | |
| 2017/0194396 A1 | 7/2017 | Choe | |
| 2018/0062109 A1 | 3/2018 | Kim | |
| 2018/0123088 A1 | 5/2018 | Kim et al. | |
| 2018/0138441 A1 | 5/2018 | Choung et al. | |

FOREIGN PATENT DOCUMENTS

| | | |
|---|---|---|
| EP | 3 321 989 A1 | 5/2018 |
| JP | 2009-32673 | 2/2009 |
| JP | 2011-065837 | 3/2011 |
| JP | 2016-039029 | 3/2016 |
| KR | 10-2002-0006306 A | 1/2002 |
| KR | 10-2002-0029553 A | 4/2002 |
| KR | 10-0714012 B1 | 5/2007 |
| KR | 10-2009-0004672 A | 1/2009 |
| KR | 10-1310917 B1 | 9/2013 |
| KR | 10-2014-0088369 A | 7/2014 |
| KR | 10-2016-0043530 A | 4/2016 |
| KR | 10-2017-0080306 A | 7/2017 |
| KR | 10-2017-0082188 A | 7/2017 |
| KR | 10-2018-0055024 A | 5/2018 |

* cited by examiner

ORGANIC LIGHT-EMITTING DISPLAY APPARATUS AND METHOD OF MANUFACTURING THE SAME

CROSS-REFERENCE TO RELATED APPLICATIONS

This application is a divisional of U.S. patent application Ser. No. 16/239,085, filed Jan. 3, 2019, which claims priority to and the benefit of Korean Patent Application No. 10-2018-0010846, filed Jan. 29, 2018, the entire content of both of which is incorporated herein by reference.

BACKGROUND

1. Field

One or more embodiments relate to a method of manufacturing an organic light-emitting display apparatus.

2. Description of the Related Art

Organic light-emitting display apparatuses have attracted attention as next-generation display apparatuses due to advantages such as a wide viewing angle, a high contrast ratio, and a fast response time. In addition, organic light-emitting display apparatuses do not require a separate light source, and may operate at a low voltage and have a lightweight and thin design.

An organic light-emitting display apparatus includes an organic light-emitting device (OLED) on a display area, and the OLED includes a pixel electrode and a counter electrode that face each other, and an intermediate layer located between the pixel electrode and the counter electrode and including an emission layer.

SUMMARY

Embodiments are directed to an organic light-emitting display apparatus, including a substrate including a plurality of pixel areas and non-pixel areas in a display area, a plurality of pixel electrodes respectively corresponding to the plurality of pixel areas, a pixel-defining layer including a cover portion and openings, wherein the cover portion covers an edge of each of the plurality of pixel electrodes, and each of the openings exposes a central portion of a pixel electrode among the plurality of pixel electrodes, an auxiliary electrode located such that the auxiliary electrode corresponds to at least a portion of a top surface of the cover portion, and an intermediate layer and a counter electrode, each located in the openings. The pixel-defining layer may have an under-cut structure in which the at least a portion of the top surface of the cover portion is recessed from the auxiliary electrode.

The intermediate layer may include an emission layer, a lower functional layer located under the emission layer, and an upper functional layer located over the emission layer. At least a portion of the intermediate layer may be located over the auxiliary electrode. At least a portion of the lower functional layer located over the auxiliary electrode may be spaced apart from a portion of the lower functional layer located inside the openings.

The lower functional layer may include at least one of a hole injection layer and a hole transport layer.

The intermediate layer may include an organic emission layer, a lower functional layer located under the organic emission layer, and an upper functional layer located over the organic emission layer. A thickness of the auxiliary electrode may be greater than a thickness of the lower functional layer.

The auxiliary electrode may have a mesh form with through-holes corresponding to the openings of the pixel-defining layer.

A width of the counter electrode may be greater than a width of the intermediate layer.

An end portion of the counter electrode may extend toward and contact the auxiliary electrode.

The auxiliary electrode may include at least one of molybdenum (Mo) and titanium (Ti), and the counter electrode may include Yb/Ag:Mg/ITO.

A plurality of thin-film transistors (TFTs) electrically connected to the plurality of pixel electrodes may be on the substrate.

The organic light-emitting display apparatus may further include a thin-film encapsulation layer located on the display area. The thin-film encapsulation layer may include at least one inorganic film and at least one organic film.

Embodiments are also directed to a method of manufacturing an organic light-emitting display apparatus, including providing a substrate on which a plurality of pixel electrodes are formed, and forming a pixel-defining layer including a cover portion and openings. The cover portion may cover an edge of an adjacent pixel electrode from among the plurality of pixel electrodes. The openings may respectively expose a central portion of each of the plurality of pixel electrodes. The method further includes forming an auxiliary electrode such that the auxiliary electrode corresponds to at least a portion of a top surface of the cover portion, forming, by etching a side surface of the cover portion, an under-cut structure in which the at least a portion of the top surface of the cover portion is recessed from the auxiliary electrode, and forming a first masking layer such that a first pixel electrode from among the plurality of pixel electrodes is exposed, and then forming, on the first pixel electrode, a first intermediate layer and a first counter electrode.

Forming the auxiliary electrode and forming the under-cut structure may be performed using a same photoresist pattern.

The pixel-defining layer may include an organic material. Etching the side surface of the cover portion may be performed by dry etching using an oxygen plasma.

The pixel-defining layer may include an inorganic material. Etching the side surface of the cover portion may be performed by dry etching using a $SF_6$ gas.

The first intermediate layer includes an emission layer, a lower functional layer located under the emission layer, and an upper functional layer located over the emission layer. A thickness of the auxiliary electrode may be greater than a thickness of the lower functional layer.

The first intermediate layer may include an emission layer, a lower functional layer located under the emission layer, and an upper functional layer located over the emission layer. At least a portion of the first intermediate layer may be located over the auxiliary electrode. At least a portion of the lower functional layer located over the auxiliary electrode may be spaced apart from a portion of the lower functional layer located inside the openings.

The lower functional layer may include at least one of a hole injection layer and a hole transport layer.

An end portion of the first counter electrode may extend toward and contact the auxiliary electrode.

The method may further include removing the first masking layer by a lift-off process, forming a second masking layer such that a second pixel electrode from among the plurality of pixel electrodes is exposed, forming, on the second pixel electrode, a second intermediate layer and a second counter electrode, removing the second masking layer by a lift-off process, forming a third masking layer such that a third pixel electrode from among the plurality of pixel electrodes is exposed, and forming, on the third pixel electrode, a third intermediate layer and a third counter electrode.

The substrate may include a plurality of thin-film transistors (TFTs) electrically connected to the plurality of pixel electrodes.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
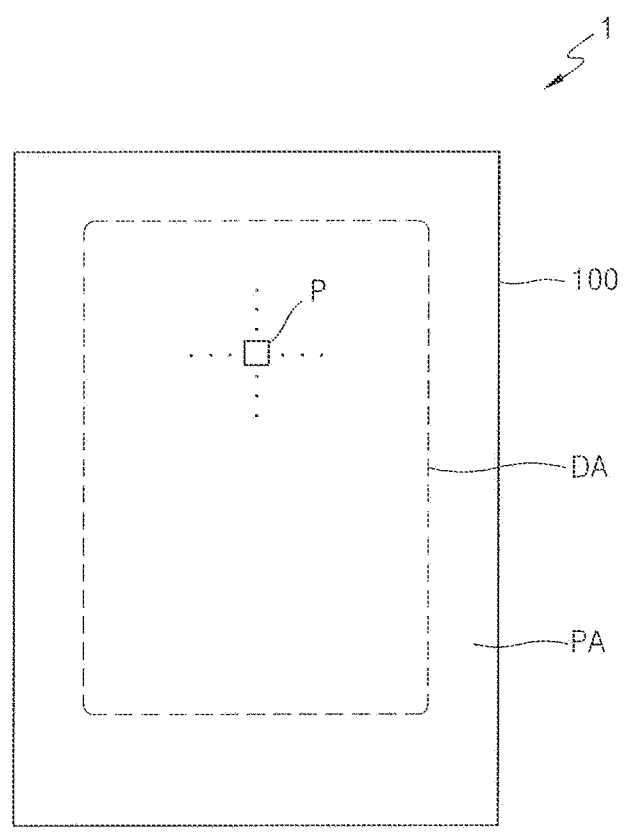
FIG. 1 illustrates a plan view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a plan view of an organic light-emitting display apparatus 1 according to an embodiment.

Referring to FIG. 1, the organic light-emitting display apparatus 1 may include a display area DA and a peripheral area PA that is a non-display area. The display area DA, on which pixels P each including an organic light-emitting device (OLED) are located, provides a predetermined image. The peripheral area PA, which does not provide an image, may include a scan driver and a data driver for applying electrical signals to the pixels P of the display area DA and power supply lines for supplying power such as a driving voltage and a common voltage.

Figure 2A:
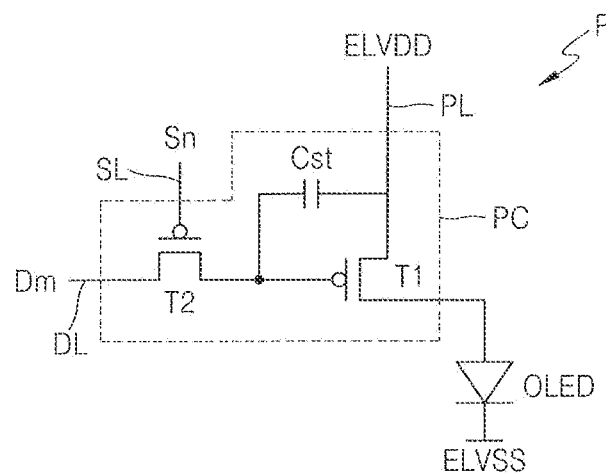
FIGS. 2A and 2B illustrate equivalent circuit diagrams of a pixel, according to embodiments.
Figure 2B:
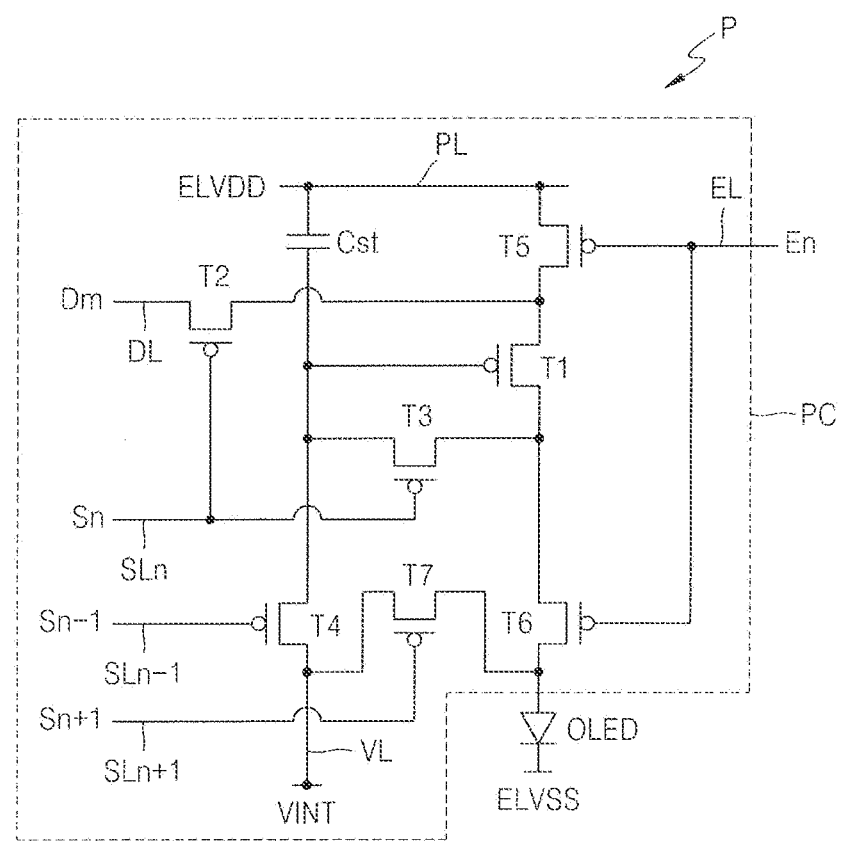

FIGS. 2A and 2B illustrate equivalent circuit diagrams of each pixel P according to embodiments.

Referring to FIG. 2A, each pixel P includes a pixel circuit PC connected to a scan line SL and a data line DL and an OLED connected to the pixel circuit PC.

The pixel circuit PC may include a driving thin-film transistor (TFT) T1, a switching TFT T2, and a storage capacitor Cst. The switching TFT T2 may be connected to the scan line SL and the data line DL. The switching TFT T2 may apply a data signal Dm, input through the data line DL according to a scan signal Sn input through the scan line SL, to the driving TFT T1.

The storage capacitor Cst may be connected to the switching TFT T2 and a driving voltage line PL. The storage capacitor Cst may store a voltage corresponding to a difference between a voltage received from the switching TFT T2 and a driving voltage ELVDD supplied to the driving voltage line PL.

The driving TFT T1 may be connected to the driving voltage line PL and the storage capacitor Cst. The driving TFT T1 may control a driving current flowing through the OLED from the driving voltage line PL in accordance with a value of the voltage stored in the storage capacitor Cst. The organic light-emitting display apparatus may emit light having a predetermined luminance using the driving current.

The pixel P illustrated in FIG. 2A includes two TFTs and one storage capacitor Cst. In some implementation, the pixel P may include a different number of TFTs.

Referring to FIG. 2B, the pixel circuit PC may include the driving and switching TFTs T1 and T2, a compensation TFT T3, a first initialization TFT T4, a first emission control TFT T5, a second emission control TFT T6, and a second initialization TFT T7.

A drain electrode of the driving TFT T1 may pass through the second emission control TFT T6 to be electrically connected to the OLED. The driving TFT T1 may receive the data signal Dm according to a switching operation of the switching TFT T2 and may supply driving current to the OLED.

A gate electrode of the switching TFT T2 may be connected to the scan line SL. A source electrode of the switching TFT T2 may be connected to the data line DL. A drain electrode of the switching TFT T2 may be connected to a source electrode of the driving TFT T1 and may pass through the first emission control TFT T5 and to be connected to the driving voltage line PL.

The switching TFT T2 may be turned on according to the scan signal Sn (referred to as first scan signal) received through the scan line SL. The switching TFT T2 may perform a switching operation of applying the data signal Dm transmitted through the data line DL to the source electrode of the driving TFT T1.

A gate electrode of the compensation TFT T3 may be connected to a first scan line SLn. A source electrode of the compensation TFT T3 may be connected to the drain electrode of the driving TFT T1, and may pass through the second emission control TFT T6 to be connected to a pixel electrode of the OLED. A drain electrode of the compensation TFT T3 may be connected to any one electrode of the storage capacitor Cst, a source electrode of the first initialization TFT T4, and a gate electrode of the driving TFT T1. The compensation TFT T3 may be turned on according to the first scan signal Sn received through the scan line SL. The first TFT T3 may perform diode-connection on the driving TFT T1 by connecting the gate electrode and the drain electrode of the driving TFT T1.

A gate electrode of the first initialization TFT T4 may be connected to a second scan line SLn−1. A drain electrode of the first initialization TFT T4 may be connected to an initialization voltage line VL. The source electrode of the first initialization TFT T4 may be connected to any one electrode of the storage capacitor Cst, the drain electrode of the compensation TFT T3, and the gate electrode of the driving TFT T1. The first initialization TFT T4 may be turned on according to a second scan signal Sn−1 received through the second scan line SLn−1. The first initialization TFT T4 may perform an initialization operation of applying an initialization voltage VINT to the gate electrode of the driving TFT T1 to initialize a voltage of the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 may be connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the OLED. The first emission control TFT T5 and the second emission control TFT T6 may be simultaneously turned on according to an emission control signal En received through the emission control line EL. Thus, the driving voltage ELVDD may be applied to the OLED and driving current may flow through the OLED.

A gate electrode of the second initialization TFT T7 may be connected to a third scan line SLn+1. A source electrode of the second initialization TFT T7 may be connected to the pixel electrode of the OLED. A drain electrode of the second initialization TFT T7 may be connected to the initialization voltage line VL. The second initialization TFT T7 may be turned on according to a third scan signal Sn+1 received through the third scan line SLn+1. The second initialization TFT T7 may initialize the pixel electrode of the OLED.

Another electrode of the storage capacitor Cst may be connected to the driving voltage line PL. Any one electrode of the storage capacitor Cst may be connected to the gate electrode of the driving TFT T1, the drain electrode of the compensation TFT T3, and the source electrode of the first initialization TFT T4.

A counter electrode of the OLED may receive a common power supply voltage ELVSS. The OLED may receive the driving current from the driving TFT T1 to emit light.

In some implementations, the number of TFTs and storage capacitors and the circuit design may be varied.

Figure 3:
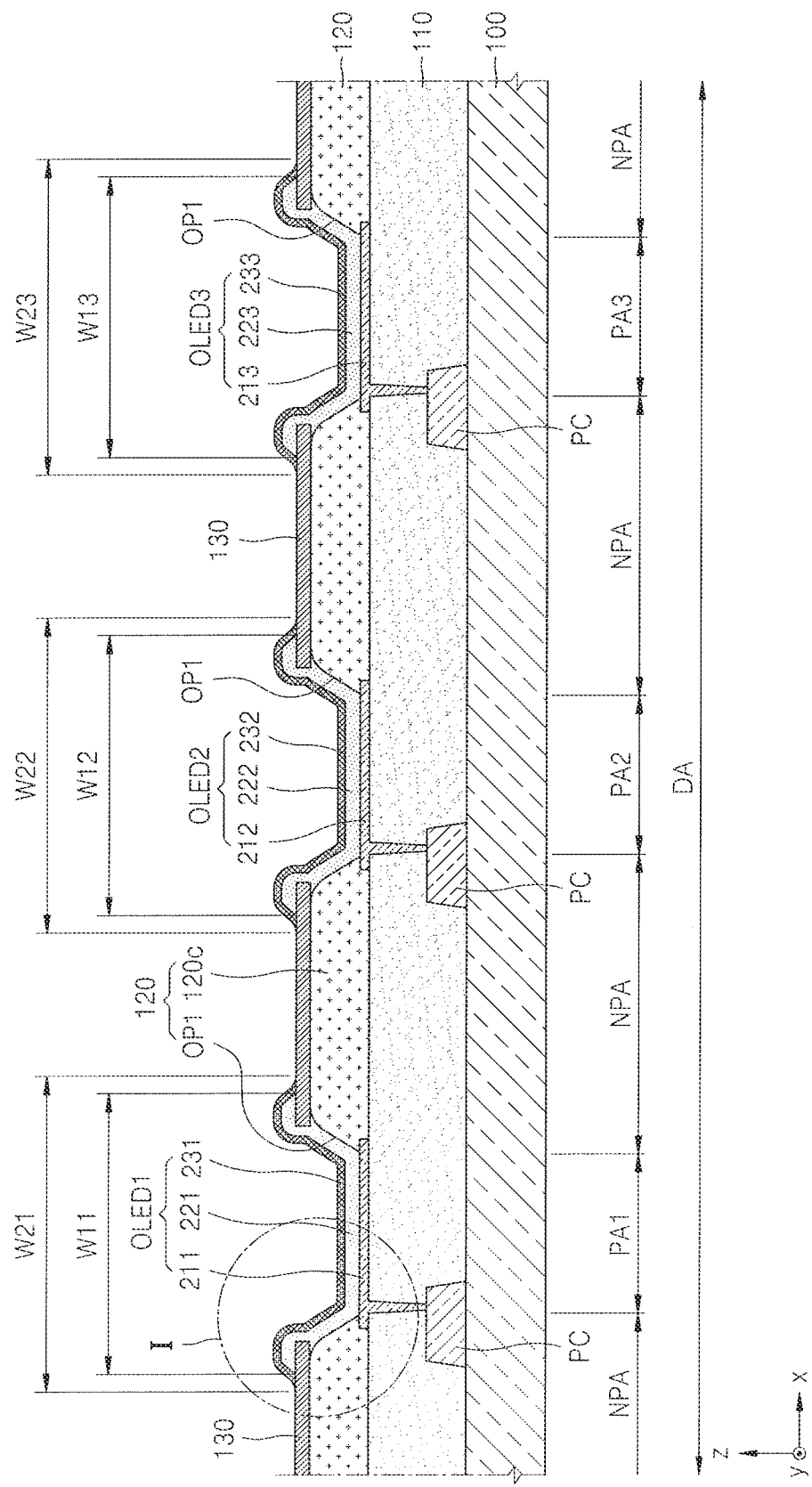
FIG. 3 illustrates a cross-sectional view of an organic light-emitting display apparatus according to an embodiment.
Figure 4:
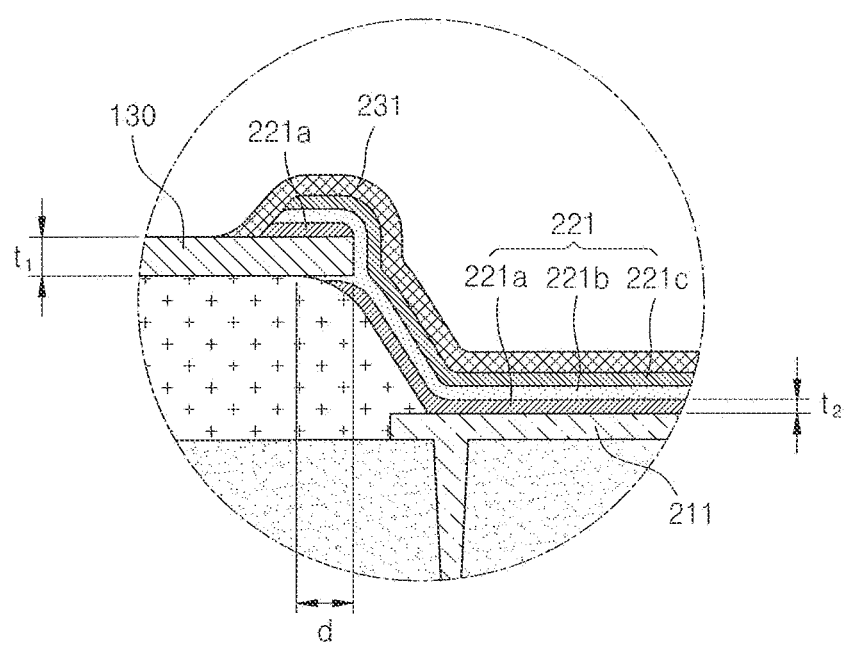
FIG. 4 illustrates an enlarged cross-sectional view illustrating portion I of FIG. 3.

FIG. 3 illustrates a cross-sectional view of a display apparatus according to an embodiment. FIG. 4 illustrates an enlarged cross-sectional view of a portion I of FIG. 3.

Referring to FIG. 3, the display area DA may include first through third pixel areas PA1, PA2, and PA3 on which pixels, for example, first through third pixels P1, P2, and P3, are located. The display area D1 may include a non-pixel area NPA between adjacent pixel areas. The term 'pixel area' used herein refers to an area where light is actually emitted, that is, a light-emitting area.

The first through third pixels P1, P2, and P3 may emit light of different colors. For example, the first pixel P1 may emit red light, the second pixel P2 may emit green light, and the third pixel P3 may emit green light. In some implementations, the display area DA may further include a fourth pixel that emits white light.

A substrate 100 may include a suitable material such as a glass material, or a plastic material (e.g., polyethylene terephthalate (PET), polyethylene naphthalate (PEN), or polyimide). Flexibility when the substrate 100 is formed of a plastic material may be greater than flexibility when the substrate 100 is formed of a glass material.

A circuit device layer 110 including the pixel circuit PC may be provided on the substrate 100. The pixel circuit PC may include a TFT and a storage capacitor as described with reference to FIGS. 2A and 2B. Layers such as, for example, a semiconductor layer and electrode layers of the TFT and the storage capacitor, may be located with an insulating layer therebetween. The pixel circuit PC may located with respect to each of the first through third pixels P1, P2, and P3.

The first through third pixels P1, P2, and P3 may respectively include first through third OLEDs OLED1, OLED2, and OLED3 electrically connected to the pixel circuits PC. Each of the first through third OLEDs OLED1, OLED2, and OLED3 may include a pixel electrode, an intermediate layer including an emission layer, and a counter electrode.

OLED1 may include a first pixel electrode 211, a first intermediate layer 221, and a first counter electrode 231. T OLED2 may include a second pixel electrode 212, a second intermediate layer 222, and a second counter electrode 232. OLED3 may include a third pixel electrode 213, a third intermediate layer 223, and a third counter electrode 233.

An end portion of each of the first through third pixel electrodes 211, 212, and 213 may be covered by a pixel-defining layer 120. A central portion of each of the first through third pixel electrodes 211, 212, and 213 may be exposed through an opening OP1 and may contact each of the first through third intermediate layers 221, 222, and 223 through the opening OP1.

For example, the pixel-defining layer 120 may include a cover portion 120c that covers the end portion of each of the first through third pixel electrodes 211, 212, and 213 and the opening OP1 through which the central portion of each of the first through third pixel electrodes 211, 212, and 213 is exposed.

Each of the first through third intermediate layers 221, 222, and 223 including the emission layer may be located on a portion of each of the first through third pixel electrodes 211, 212, and 213 exposed by the pixel-defining layer 120. The first through third counter electrodes 231, 232, and 233 may be respectively located on the first through third intermediate layers 221, 222, and 223. Light may be emitted from the intermediate layer between the pixel electrode and the counter electrode. Accordingly, each pixel area is defined by the pixel-defining layer 120.

The pixel-defining layer 120 may include an organic material or an inorganic material. When the pixel-defining layer 120 includes an organic material, the pixel-defining layer 120 may include at least one organic insulating material selected from polyimide, polyamide, acrylic resin, benzocyclobutene, and phenolic resin. When the pixel-defining layer 120 includes an inorganic material, the pixel-defining layer 120 may have a single-layer structure or a multi-layer structure including silicon oxide (SiOx), silicon nitride (SiNx), and/or silicon oxynitride (SiON).

The auxiliary electrode 130 may be located on the cover portion 120c of the pixel-defining layer 120. For example, the pixel electrode 130 may be located to correspond to the non-pixel area NPA between adjacent pixel areas of the first through third pixel areas PA1, PA2, and PA3. The auxiliary electrode 130 may be connected to a common power supply line and may apply the common power supply voltage ELVSS to each of the first through third pixels P1, P2, and P3.

The auxiliary electrode 130 may include a conductive material, for example, a metal or a transparent conductive oxide (TCO). The auxiliary electrode 130 may have a single-layer structure or a multi-layer structure. In some implementations, the auxiliary electrode 130 may include a metal such as molybdenum (Mo) or titanium (Ti).

The pixel-defining layer 120 may have an under-cut structure in which an upper portion of the pixel-defining layer 120 on which the auxiliary electrode 130 is located is recessed from the auxiliary electrode 130. For example, the pixel-defining layer 120 may include the under-cut structure in which at least a part of a top surface of the cover portion 120c of the pixel-defining layer 120 is recessed from the auxiliary electrode 130. The under-cut structure may be used to minimize defects of the first through third OLEDs OLED1, OLED2, and OLED3, as will be described below.

The first through third pixel electrodes 211, 212, and 213 may have island shapes respectively corresponding to the first through third pixel areas PA1, PA2, and PA3. The first through third pixel electrodes may located on the circuit device layer 110 so as to be spaced apart from one another.

Each of the first through third pixel electrodes 211, 212, and 213 may be a reflective electrode or a transmissive electrode.

When each of the first through third pixel electrodes 211, 212, and 213 is a reflective electrode, each of the first through third pixel electrodes 211, 212, and 213 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof. In some implementations, each of the first through third pixel electrodes 211, 212, and 213 may include a reflective film, and a TCO film located over or/and under the reflective film. In an embodiment, each of the first through third pixel electrodes 211, 212, and 213 may have a three-layer structure formed of ITO/Ag/ITO.

When each of the first through third pixel electrodes 211, 212, and 213 is a transmissive electrode, each of the first through third pixel electrodes 211, 212, and 213 may be a TCO layer. In some implementations, each of the first through third pixel electrodes 211, 212, and 213 may be in a form of a metal thin film including silver (Ag) or an Ag alloy, or may have a multi-layer structure including a metal thin film and a TCO layer formed on the metal thin film.

The first through third intermediate layers 221, 222, and 223 may have island shapes located to respectively correspond to the first through third pixel areas PA1, PA2, and PA3. The first through third intermediate layers 221, 222, and 223 may be spaced apart from one another. The first through third intermediate layers 221, 222, and 223 may be respectively located on the first through third pixel electrodes 211, 212, and 213 exposed through the openings OP1 of the pixel-defining layer 120. At least a part of each of the first through third intermediate layers 221, 222, and 223 may extend along a side surface of the opening OP1 of the pixel-defining layer 120 and extend over the auxiliary electrode 130.

Referring to FIGS. 3 and 4, the first intermediate layer 221 may include an emission layer 221b. The emission layer 221b may be an organic emission layer that emits, for example, red light. The first intermediate layer 221 may further include a lower functional layer 221a located under the emission layer 221b and/or an upper functional layer 221c located over the emission layer 221b. The lower functional layer 221a may include a hole injection layer (HIL) and/or a hole transport layer (HTL). The upper functional layer 221c may include an electron transport layer (ETL) and/or an electron injection layer (EIL). The lower functional layer 221a and/or the upper functional layer 221c may help the emission layer 221b to efficiently emit light by matching an energy level of the emission layer 221b to the first pixel electrode 211 or the first counter electrode 231.

Each emission layer may be formed of suitable light-emitting materials. For example, each emission layer may be formed to include a host and a dopant. The dopant may be a fluorescent dopant or a phosphorescent dopant.

For example, the host may be Alq3C 4,4'-N,N'-dicarbazole-biphenyl (CBP), 9,10-di(naphthalene-2-yl)anthracene (ADN), or distyrylarylene (DSA).

An HIL material may be, for example, a phthalocyanine compound such as copper phthalocyanine, 4,4',4"-tris(3-methylphenylphenylamino) (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphorsulfonic acid (Pani/CSA), or polyaniline/poly(4-styrenesulfonate) (PANI/PSS).

An HTL material may be, for example, a carbazole derivative such as N-phenylcarbazole or polyvinyl carbazole, an amine derivative having a fused aromatic ring such as, NPB, N,N'-bis(3-methylphenyl)-N,N'-diphenyl-[1,1-biphenyl]-4,4'-diamine (TPD) or N,N'-di(naphthalene-1-yl)-N,N'-diphenyl benzidine (α-NPD), or 4,4',4"-tris(N-carbazolyl)triphenylamine (TCTA). From among these, for example, TCTA may prevent the diffusion of excitons from the emission layer, in addition to performing a hole transport function.

An ETL material may be, for example, a quinoline derivative such as tris(8-quinolinolate)aluminum (Alq3), TAZ, or Balq.

An EIL material may be, for example LiF, NaClC CsF, $Li_2O$, or BaO.

Each of the lower functional layer 221a and the upper functional layer 221c may have a single-layer structure or a multi-layer structure. In some implementations, the lower functional layer 221a and/or the upper functional layer 221c may be omitted.

The lower functional layer 221a, the emission layer 221b, and the upper functional layer 221c on the auxiliary electrode 130 may have a forward taper shape such that a side surface of each of the lower functional layer 221a, the emission layer 221b, and the upper functional layer 221c has a predetermined angle as shown in FIG. 4. In some implementations, the upper functional layer 221c may extend downwardly along a side surface of the emission layer 221b or a side surface of the lower functional layer 221a. In some implementations, the emission layer 221b may be deposited to extend downwardly along a side surface of the lower functional layer 221a.

As described above, the pixel-defining layer 120 may have the under-cut structure in which an upper portion of the pixel-defining layer 120 on which the auxiliary electrode 130 is located is recessed from the auxiliary electrode 130. Due to the under-cut structure, the lower functional layer 221a located under the emission layer 221b and the emission layer 221b may each include a portion located over the auxiliary electrode 130 and a portion located inside the opening OP1.

If the auxiliary electrode 130 and the pixel-defining layer 120 were to not have the under-cut structure, the lower functional layer 221a could continuously extend from the inside of the opening OP1 to the top of the auxiliary electrode 130. In this case, the first counter electrode 231 could be connected to the lower functional layer 221a, and electrons injected through the first counter electrode 231 could flow into the first pixel electrode 211 through the lower functional layer 221a, thereby leading to undesirable lateral leakage.

However, in the present embodiment, the pixel-defining layer 120 has the under-cut structure in which the pixel-defining layer 120 is recessed from the auxiliary electrode 130. Accordingly, the portion of the lower functional layer 221a located over the auxiliary electrode 130 and the portion of the lower functional layer 221a located inside the opening OP1 may be spaced apart from each other, thereby helping to prevent lateral leakage.

In the present embodiment, a thickness $t_1$ of the auxiliary electrode 130 may be greater than a thickness $t_2$ of the lower functional layer 221a. When the thickness $t_1$ of the auxiliary electrode 130 is greater than the thickness $t_2$ of the lower functional layer 221a, the portion of the lower functional layer 221a located over the auxiliary electrode 130 and the portion of the lower functional layer 221a located inside the opening OP1 may not connect to each other during deposition.

In the present embodiment, a distance d of the cover portion 120c of the pixel-defining layer 120 that is concaved inwardly from an end portion of the auxiliary electrode 130 may be greater than the thickness $t_2$ of the lower functional layer 221a. Accordingly, the portion of the lower functional layer 221a located over the auxiliary electrode 130 and the portion of the lower functional layer 221a located inside the opening OP1 may not connect to each other during deposition.

In the present embodiment, at least a part of the emission layer 221b and/or the upper functional layer 221c may also be formed such that a portion located over the auxiliary electrode 130 and a portion located inside the opening OP1 are spaced apart from each other. Suitable modifications may be made according to a thickness of the auxiliary electrode 130 and a distance of the cover portion 120c that is concaved inwardly from an end portion of the auxiliary electrode 130.

Referring back to FIG. 3, the second intermediate layer 222 may include an organic emission layer that emits green light. The third intermediate layer 223 may include an organic emission layer that i that emits blue light. Each of the second intermediate layer 222 and the third intermediate layer 223 may further include a lower functional layer located under the emission layer and/or an upper functional layer located over the emission layer. The lower functional layer may be an HIL and/or an HTL, and the upper functional layer may be an ETL and/or an EIL. In each of the second intermediate layer 222 and the third intermediate layer 223, a portion of the lower functional layer located over the auxiliary electrode 130 and a portion of the lower functional layer located inside the opening OP1 may be spaced apart from each other, and a thickness of the auxiliary electrode 130 may be greater than a thickness of the lower functional layer.

Thicknesses of the first through third intermediate layers 221, 222, and 223 may be different from one another. The first through third intermediate layers 221, 222, and 223 are independently/individually patterned in a subsequent process. Accordingly, materials and thicknesses of functional layers of the first through third intermediate layers 221, 222, and 223 may be different from one another.

The first through third counter electrodes 231, 232, and 233 may have island shapes to respectively correspond to the first through third pixel areas PA1, PA2, and PA3, and may be spaced apart from one another. The first through third counter electrodes 231, 232, and 233 may be respectively located on the first through third intermediate layers 221, 222, and 223.

Widths W21, W22, and W23 of the first through third counter electrodes 231, 232, and 233 may be greater than widths W11, W12, and W13 of the first through third intermediate layers 221, 222, and 223. End portions of the first through third counter electrodes 231, 232, and 233 may extend farther toward the auxiliary electrode 130 than the first through third intermediate layers 221, 222, and 223 and may contact the auxiliary electrode 130.

Each of the first through third counter electrodes 231, 232, and 233 may be a transmissive electrode or a reflective electrode. Each of the first through third counter electrodes 231, 232, and 233 may include at least one of silver (Ag), magnesium (Mg), aluminum (Al), ytterbium (Yb), calcium (Ca), lithium (Li), and gold (Au). For example, each of the first through third counter electrodes 231, 232, and 233 may have a single or multi-layer structure including at least one from among Ag, Mg, Al, Yb, Ca, LiF/Ca, LiF/Al, Al, and Au. In some embodiments, each of the first through third counter electrodes 231, 232, and 233 may include a TCO film. In an implementation, each of the first through third counter electrodes 231, 232, and 233 may include a metal thin film including Ag and Mg. The amount of Ag contained in each of the first through third counter electrodes 231, 232, and 233 may be greater than the amount of Mg. In another implementation, each of the first through third counter electrodes 231, 232, and 233 may have a multi-layer structure formed of Yb/Ag:Mg/ITO.

Each of the first through third counter electrodes 231, 232, and 233 including any of the above materials may be a transmissive electrode with a small thickness or may be a reflective electrode with a large thickness. For example, each of the first through third counter electrodes 231, 232, and 233 may be a transmissive electrode obtained by forming a metal including Ag and Mg to a thickness ranging from about 10 Å to about 15 Å, or may be a reflective electrode obtained by forming a metal to a thickness equal to or greater than about 50 nm.

The first through third counter electrodes 231, 232, and 233 may be covered by a passivation layer that prevents damage to the first through third counter electrodes 231, 232, and 233 and layers located under the first through third counter electrodes 231, 232, and 233 during a manufacturing process. The passivation layer may include an inorganic insulating material such as SiOx, SiNx, and/or SiON, and may have a single or multi-layer structure.

The first through third counter electrodes 231, 232, and 233 having island shapes and spaced apart from one another may be electrically connected to one another through the auxiliary electrode 130, and may be connected to the common power supply line and may receive the common power supply voltage ELVSS.

Figure 5:
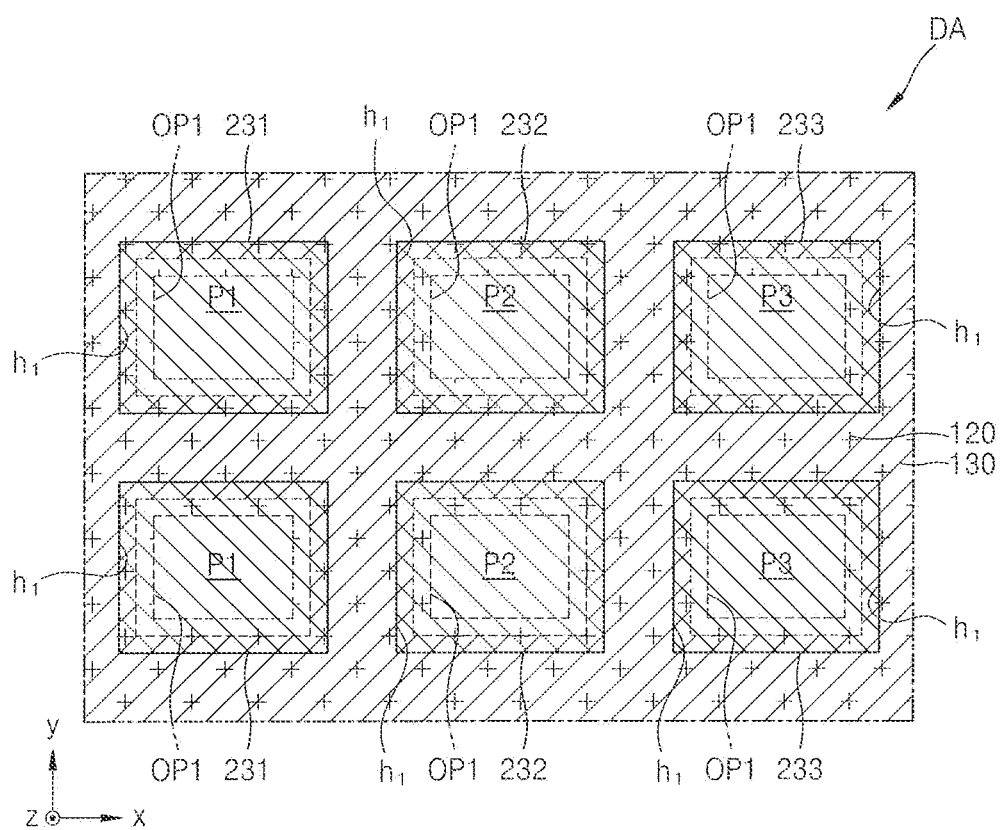
FIG. 5 illustrates a plan view of the organic light-emitting display apparatus of FIG. 3 as seen from a direction Z.
Figure 6:
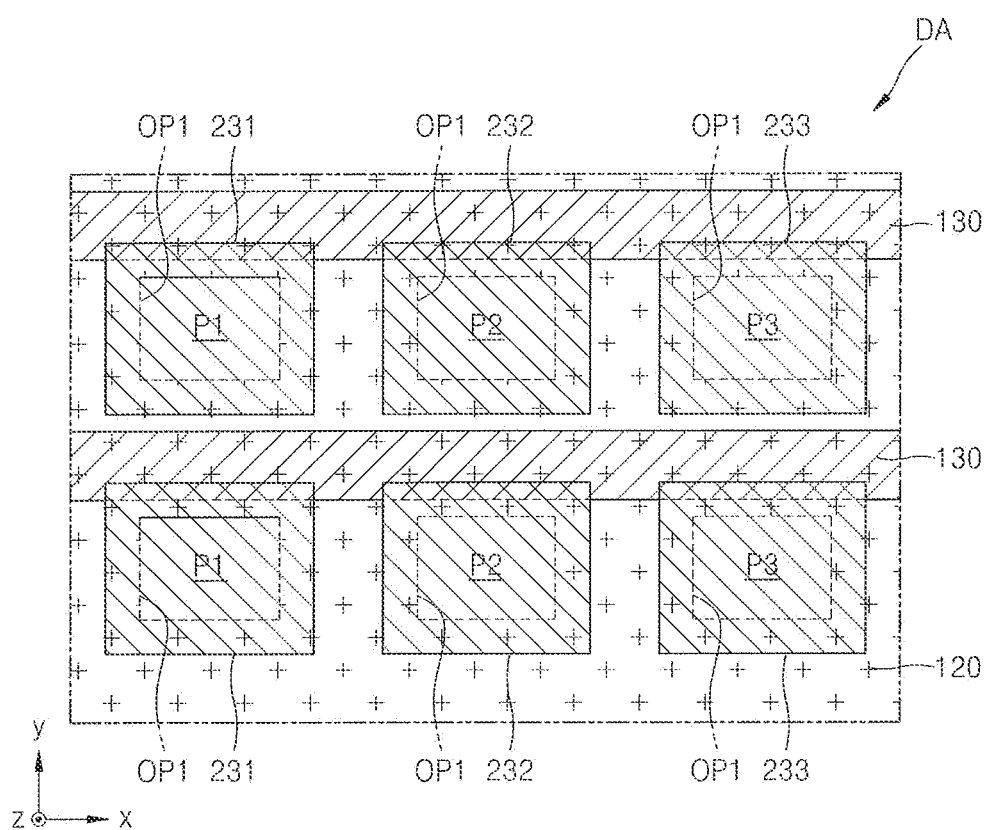
FIG. 6 illustrates a modification of FIG. 5.

FIG. 5 illustrates a plan view of the organic light-emitting display apparatus of FIG. 3 seen in a direction Z. FIG. 6 illustrates a modification of FIG. 5. For convenience of explanation, only the pixel-defining layer 120, the auxiliary electrode 130, and the first through third counter electrodes 231, 232, and 233 from among elements of the organic light-emitting display apparatus of FIG. 3 are shown in FIGS. 5 and 6.

Referring to FIG. 5, in some embodiments, the auxiliary electrode 130 may have a through-hole hi corresponding to the opening OP1 of the pixel-defining layer 120. The auxiliary electrode may be located to cover the cover portion 120c of the pixel-defining layer 120. For example, the auxiliary electrode 130 may have a mesh shape with a plurality of the through-holes hi.

The auxiliary electrode 130 may be located on the pixel-defining layer 120 of the non-pixel area NPA and may partially overlap and directly contact the first through third counter electrodes 231, 232, and 233 respectively located on the first through third pixel areas PA1, PA2, and PA3.

Referring to FIG. 6, in an embodiment, the auxiliary electrode 130 may have a stripe shape on the non-pixel area NPA. A plurality of the auxiliary electrodes 130 each having a stripe shape may be located on the pixel-defining layer 120 of the non-pixel area NPA. The auxiliary electrodes 130 may partially overlap and directly contact the first through third counter electrodes 231, 232, and 233 respectively located on the first through third pixel areas PA1, PA2, and PA3.

The auxiliary electrode 130 may be located on the pixel-defining layer 120 of the non-pixel area NPA and may partially overlap and directly contact the first through third counter electrodes 231, 232, and 233. In some implementations, the auxiliary electrode 130 may be patterned into a suitable shape other than a mesh shape or a stripe shape of FIG. 5 or 6.

Figure 7A:
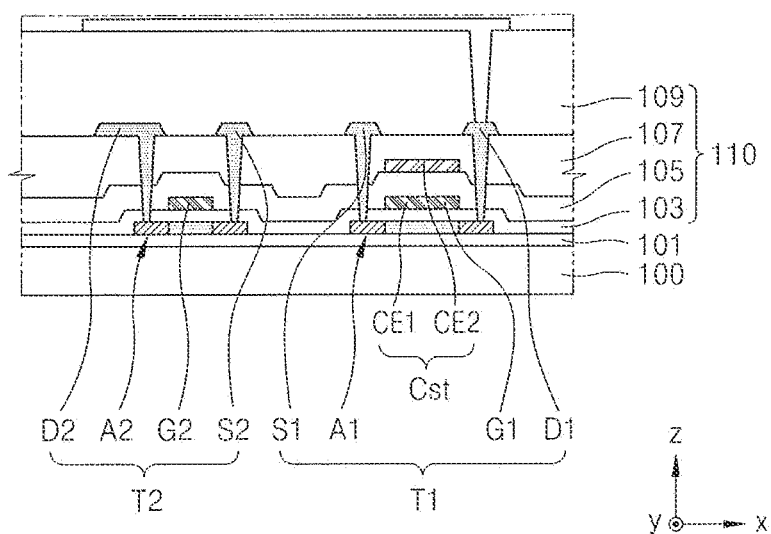
FIGS. 7A and 7B illustrate cross-sectional views of a circuit device layer of a display apparatus, according to embodiments.
Figure 7B:
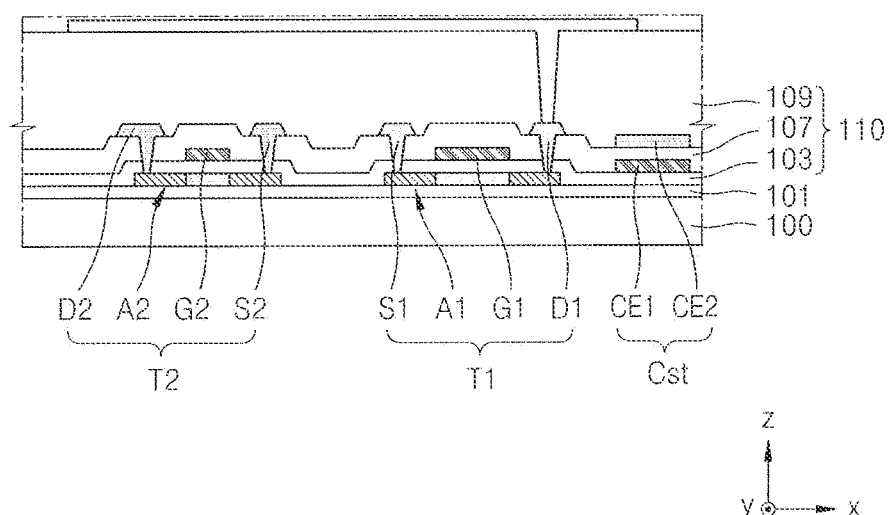

FIGS. 7A and 7B illustrate cross-sectional views of the circuit device layer 110 of an organic light-emitting display apparatus according to embodiments.

Referring to FIG. 7A, the driving TFT T1 may include a driving semiconductor layer A1, a driving gate electrode G1, a driving source electrode S1, and a driving drain electrode D1. The switching TFT T2 may include a switching semiconductor layer A2, a switching gate electrode G2, a switching source electrode S2, and a switching drain electrode D2. The storage capacitor Cst may include first and second storage capacitor plates CE1 and CE2.

A gate insulating layer 103 may be located between the driving and switching semiconductor layers A1 and A2 and the driving and switching gate electrodes G1 and G2. A dielectric layer 105 may be located between the first and second storage capacitor plates CE1 and CE2. An interlayer insulating layer 107 may be located between the driving and switching gate electrodes G1 and G2 and the driving and switching source/drain electrodes S1, D1, S2, and D2. A planarization insulating layer 109 may be located on the driving and switching source/drain electrodes S1, D1, S2, and D2.

The gate insulating layer 103 may have a single layer structure or a multi-layer structure and may include an inorganic material such as SiNx and/or silicon oxide (SiOx). Each of the dielectric layer 105 and the interlayer insulating layer 107 may include an inorganic material such as SiOx and/or $Al_2O_3$. The planarization insulating layer 109 may include, for example, an organic material including a general-purpose polymer such as polymethylmethacrylate (PMMA) or polystyrene (PS), a polymeric derivative having a phenol-based group, an acryl-based polymer, an imide-based polymer, an arylether-based polymer, an amide-based polymer, a fluorine-based polymer, a p-xylene-based polymer, a vinyl alcohol-based polymer, and/or a blend thereof.

In some implementations, the storage capacitor Cst and the driving and switching TFTs T1 and T2 may overlap each other and the driving gate electrode G1 may be the first storage capacitor plate CE1 in FIG. 7A Referring to FIG. 7B, in some implementations, the storage capacitor Cst may not overlap the driving TFT T1. For example, the first storage capacitor plate CE1 and the driving gate electrode G1 may include the same material. The second storage capacitor plate CE2 and the driving source and drain electrodes S1 and D1 may include the same material. The interlayer insulating layer 107 may be located between the first and second storage capacitor plates CE1 and CE2, In some implementations, as described with reference to FIGS. 7A and 7B, the driving and switching gate electrodes G1 and G2 of the driving and switching TFTs T1 and T2 may be respectively located over the driving and switching semiconductor layers A1 and A2. In some implementations, the driving and switching gate electrodes G1 and G2 may be respectively located under the driving and switching semiconductor layers A1 and A2. According to positions of the driving and switching gate electrodes G1 and G2, the driving and switching semiconductor layers A1 and A2 may be located directly over the inorganic buffer layer 101 in some embodiments, and the driving and switching gate electrodes G1 and G2 may be located directly over the inorganic buffer layer 101 in some embodiments.

FIGS. 8 through 17 illustrate cross-sectional views of stages of a process of manufacturing the organic light-emitting display apparatus according to an embodiment.

Figure 8:
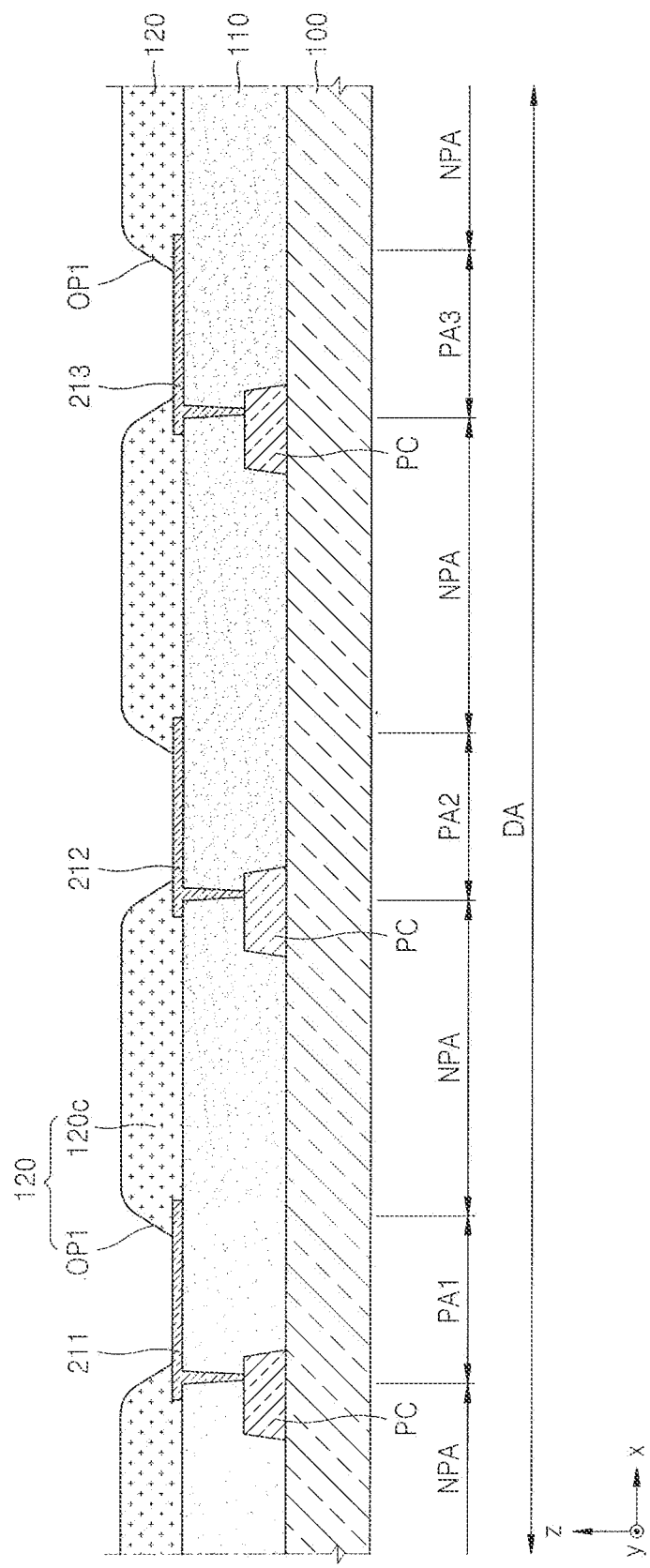
FIGS. 8 through 17 illustrate cross-sectional views for explaining stages of a method of manufacturing the organic light-emitting display apparatus of FIG. 3, according to an embodiment.

Referring to FIG. 8, the circuit device layer 110 including the pixel circuits PC may be formed on the substrate 100, and the first through third pixel electrodes 211, 212, and 213 may be formed on the circuit device layer 110. The first through third pixel electrodes 211, 212, and 213 may be formed to respectively correspond to the first through third pixel areas PA1, PA2, and PA3. For example, the first through third pixel electrodes 211, 212, and 213 may be formed by forming a preliminary pixel electrode layer on the circuit device layer 100 and then patterning the preliminary pixel electrode layer. A material of the substrate 100 and materials of the first through third pixel electrodes 211, 212, and 213 have been described with reference to FIG. 3, and thus a explanation thereof will not be repeated.

The pixel-defining layer 120 having the openings OP1 through which the first through third pixel electrodes 211, 212, and 213 are exposed may be formed by forming an insulating material layer on the first through third pixel electrodes 211, 212, and 213 and then patterning the insulating material layer.

The pixel-defining layer 120 may include an organic material or an inorganic material. When the pixel-defining layer 120 includes an organic material, the pixel-defining layer 120 may include at least one organic insulating material selected from polyimide, polyamide, acrylic resin, benzocyclobutene, and phenolic resin. When the pixel-defining layer 120 includes an inorganic material, the pixel-defining layer 120 may have a single layer structure or multi-layer structure including SiOx, SiNx, and/or SiON.

Figure 9:
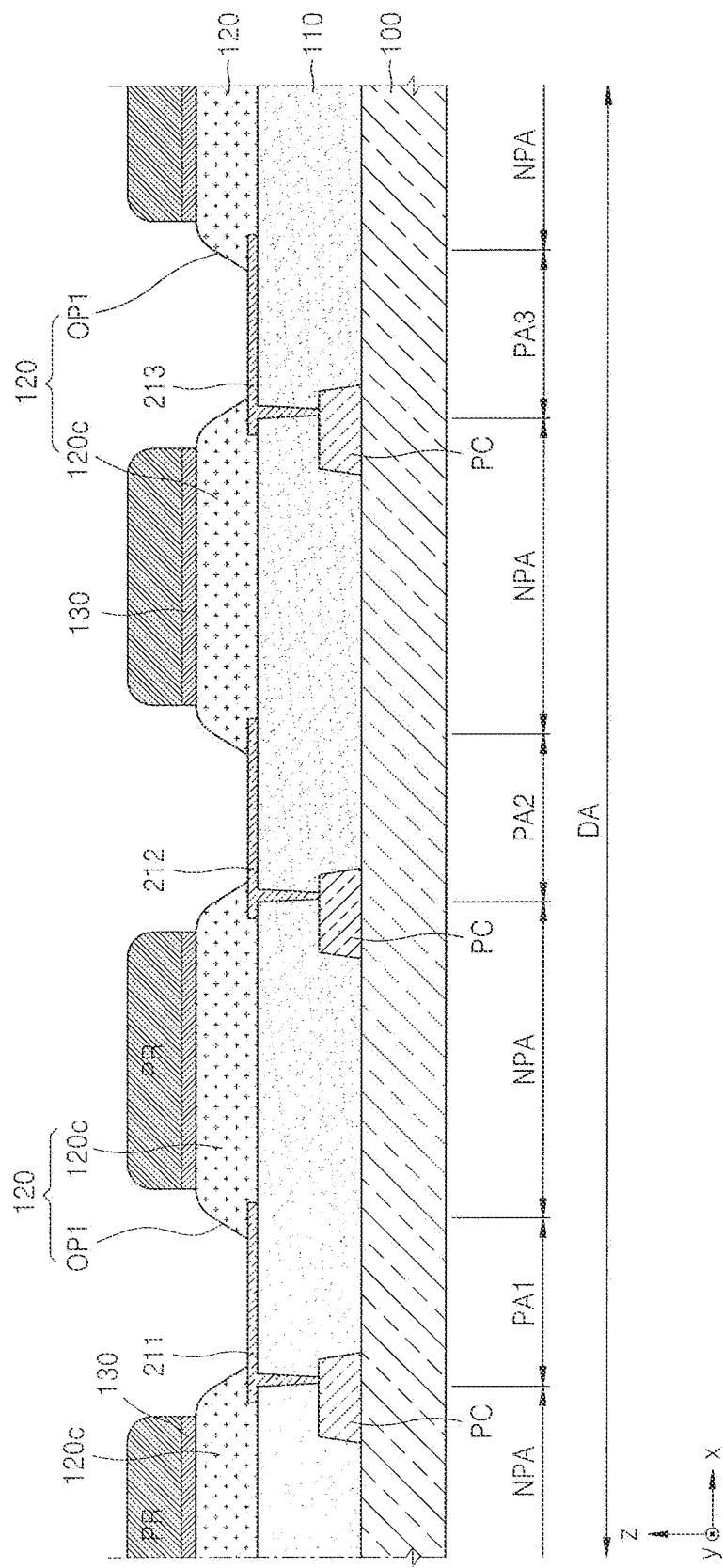

Referring to FIG. 9, an auxiliary electrode 130 may be formed over the cover portion 120c of the pixel-defining layer 120 or the non-pixel area NPA. The auxiliary electrode 130 may include a conductive material, for example, a metal or TCO. The auxiliary may have a single or multi-layer structure. In some embodiments, the auxiliary electrode 130 may include a metal such as Mo or Ti.

The auxiliary electrode 130 may be formed by forming a conductive material layer over the entire substrate 100, forming a photoresist pattern PR on the conductive material layer, and then performing etching. The etching may be wet etching, dry etching, or a combination thereof. In some embodiments, the auxiliary electrode 130 may be formed by using dry etching for precise patterning. In this case, in order to prevent damage to the first through third pixel electrodes 211, 212, and 213, a conductive material of the auxiliary electrode 130 may include a material having an etch selectivity different from that of a material of each of the first through third pixel electrodes 211, 212, and 213.

Figure 10:
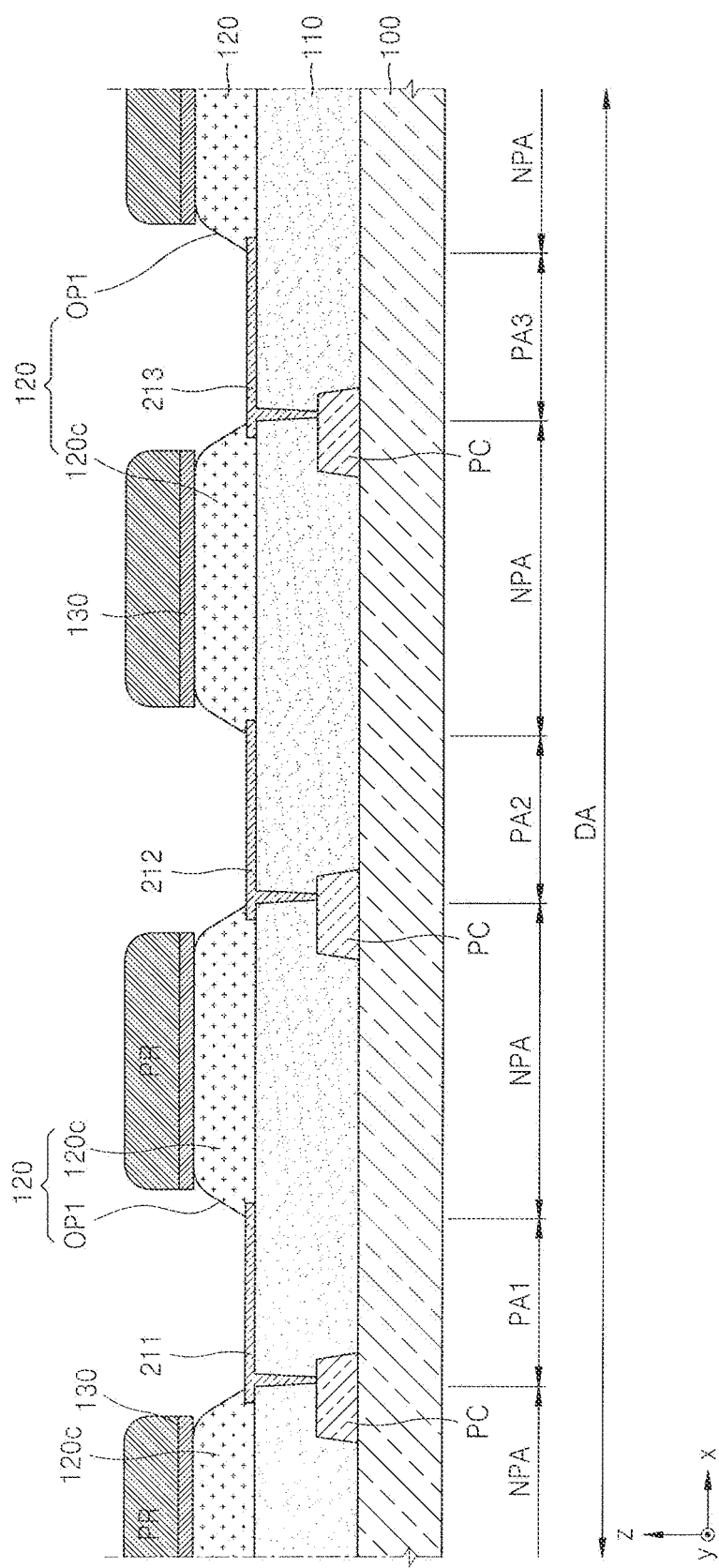

Referring to FIG. 10, a side surface of the opening OP1 may be etched to have an under-cut structure in which an upper portion of the pixel-defining layer 120 corresponding to the auxiliary electrode 130 is recessed from the auxiliary electrode 130.

The etching for the under-cut structure may be dry etching. In this case, the photoresist pattern PR for forming the auxiliary electrode 130 is not removed, such that a shape of the auxiliary electrode 130 may be maintained and the side surface of the opening OP1 of the pixel-defining layer 120 may be etched inwardly beyond an end of the auxiliary electrode 130.

A gas for the dry etching may be oxygen plasma, $SF_6$, $CHF_x$, or Cl-based gas. For example, when the pixel-defining layer 120 is formed of an organic material, the dry etching may be performed by using oxygen plasma. When the pixel-defining layer 130 is formed of an inorganic material, the dry etching may be performed by using $SF_6$.

Forming of auxiliary electrode 130 and forming the under-cut structure of the pixel-defining layer 120 may be sequentially performed by changing only an etching condition in the same chamber and using the same photoresist pattern.

Figure 11:
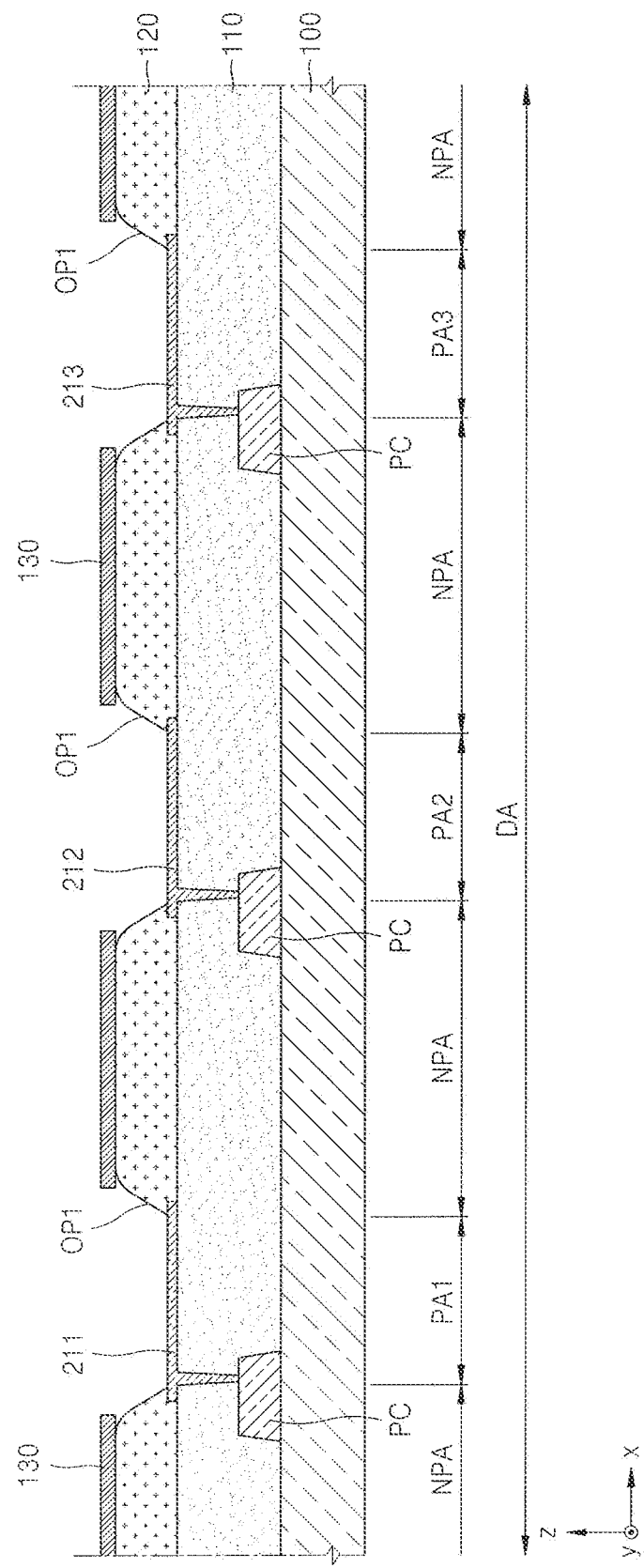

Referring to FIG. 11, after the under-cut structure of the pixel-defining layer 120 is formed, the photoresist pattern PR is removed.

Figure 12:
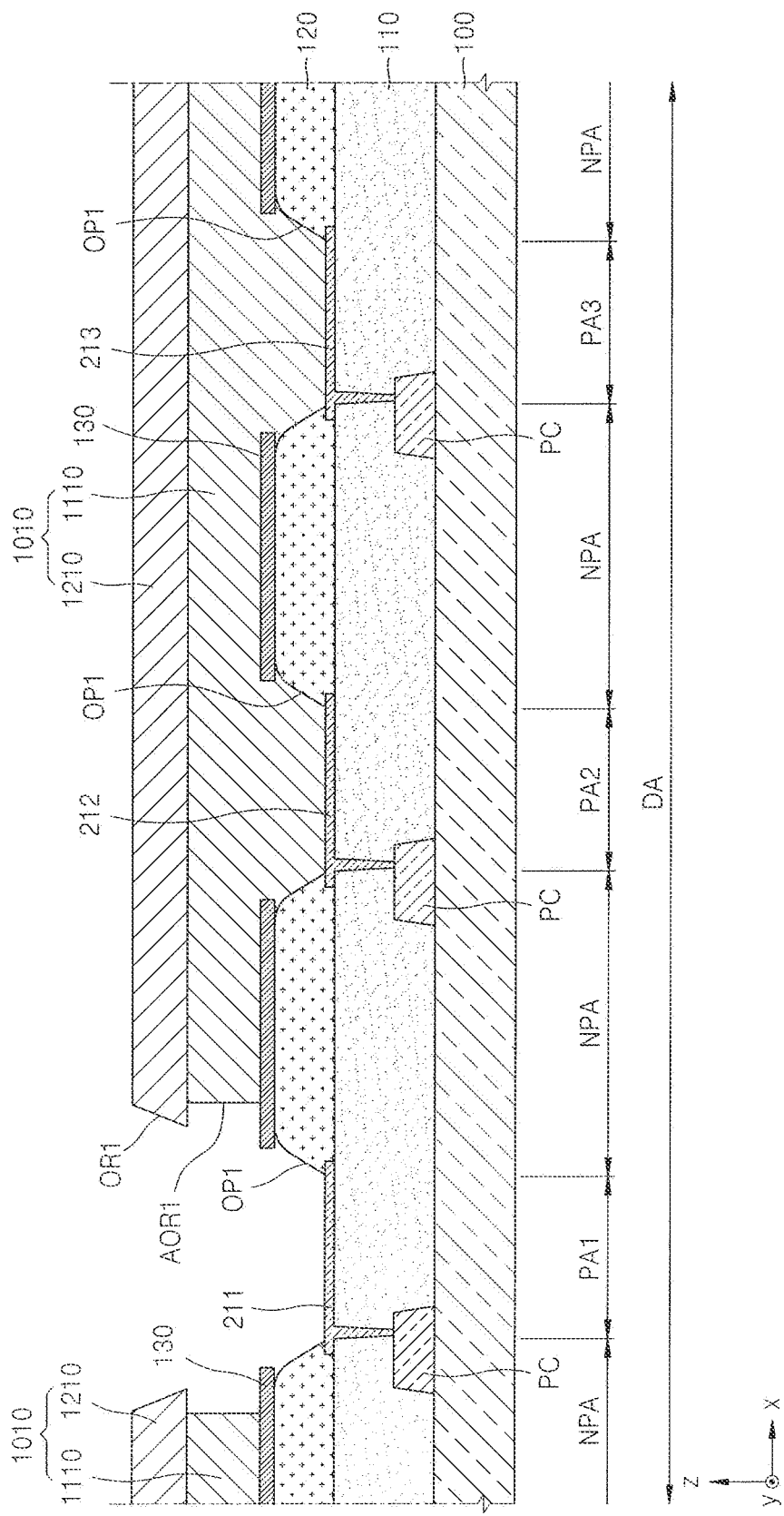

Referring to FIG. 12, a first masking layer 1010 having an open portion corresponding to the first pixel area PA1 may be formed. The first masking layer 1010 may include a first photoresist pattern layer 1210 and a first auxiliary layer 1110 between the first photoresist pattern layer 1210 and the pixel-defining layer 120.

In some embodiments, the first masking layer 1010 may be formed by using the following process.

A non-photosensitive organic material layer may be formed on the substrate 100 on which the auxiliary electrode 130 is formed, and then a photoresist layer may be formed on the non-photosensitive organic material layer. The non-photosensitive organic material layer may include, for example, a fluorine-based material. The photoresist layer may include a positive photosensitive material.

The first photosensitive pattern layer 1210 having a first opening portion OR1 may be formed by exposing and developing a portion of the photoresist layer corresponding to the first pixel area PA1. A first auxiliary opening portion AOR1 may be formed by etching a portion of the non-photosensitive organic material layer exposed through the first opening portion OR1. The first auxiliary opening portion AOR1 of the first auxiliary layer 1110 may be formed by etching such that the first auxiliary opening portion AOR1 is greater than the first opening portion OR1.

The first auxiliary layer 1110 may be located on the auxiliary electrode 130 such that an end portion of the auxiliary electrode 130 (e.g., an end portion of the auxiliary electrode 130 adjacent to the first pixel electrode 211) is exposed and not covered.

Figure 13:
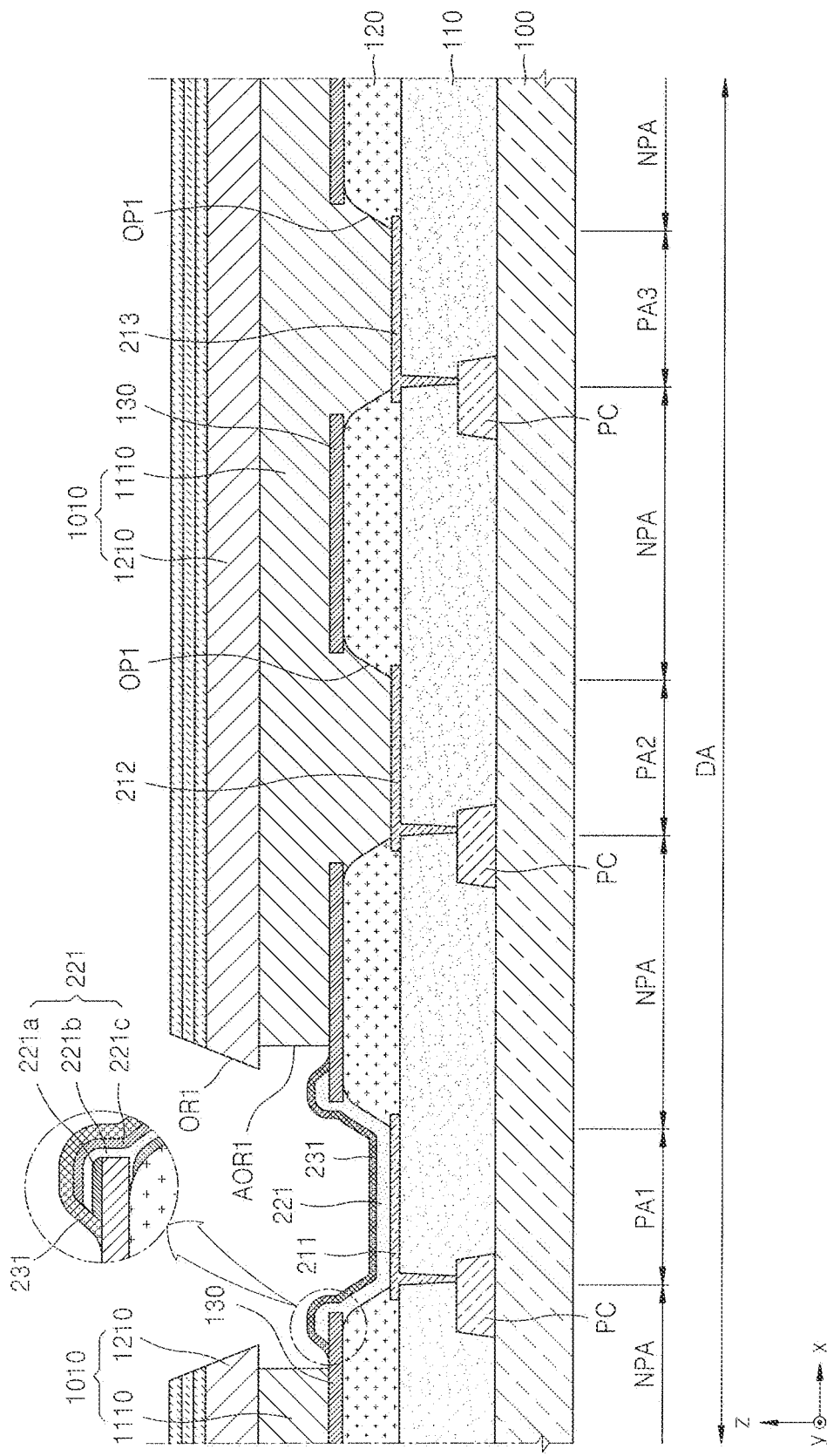

Referring to FIG. 13, the first intermediate layer 221 and the first counter electrode 231 may be sequentially formed on the substrate 100 on which the first masking layer 1010 is formed. A passivation layer may be further formed on the first counter electrode 231. Materials of the first intermediate layer 221 and the first counter electrode 231 have been described with reference to FIG. 3, and thus an explanation thereof will not be repeated and the following will focus on the process of forming the layers.

The first intermediate layer 221 and the first counter electrode 231 may be formed by using thermal evaporation. Deposition materials for forming the first intermediate layer 221 and the first counter electrode 231 may move toward the substrate 100 in a direction perpendicular or oblique to the substrate 100. Accordingly, an end portion of the first intermediate layer 221 and an end portion of the first counter electrode 231 may extend into a space under the first photosensitive pattern layer 1210 without contacting the first auxiliary layer 1110. As the deposition materials are deposited in an oblique direction, the end portions of the first intermediate layer 221 and the first counter electrode 231 may each have a forward taper shape. The end portion of the first counter electrode 231 may extend farther than the end portion of the first intermediate layer 221 and may contact the auxiliary electrode 130 such that the first counter electrode 231 has a width greater than that of the first intermediate layer 221. The first counter electrode 231 may directly contact a top surface of the auxiliary electrode 130 and may be directly connected electrically to the auxiliary electrode 130.

Referring to an enlarged view of FIG. 13, the first intermediate layer 221 may include the lower functional layer 221a, the emission layer 221b, and the upper functional layer 221c. The lower functional layer 221a, the emission layer 221b, and the upper functional layer 221c may be sequentially deposited. The pixel-defining layer 120 may have the under-cut structure in which an upper portion of the pixel-defining layer 120 is recessed from the auxiliary electrode 130. Accordingly, a portion of the lower functional layer 221a may be deposited over the auxiliary electrode 130 and a portion of the lower functional layer 221a may be deposited inside the opening OP1 such that the portion of the lower functional layer 221a deposited over the auxiliary electrode 130 and the portion of the lower functional layer 221a inside the opening OP1 are spaced apart from each other.

Portions of the emission layer 221b and/or the upper functional layer 221c may also be spaced apart from each other according to a size of the under-cut structure of the pixel-defining layer 120 and a thickness of the auxiliary electrode 130.

Figure 14:
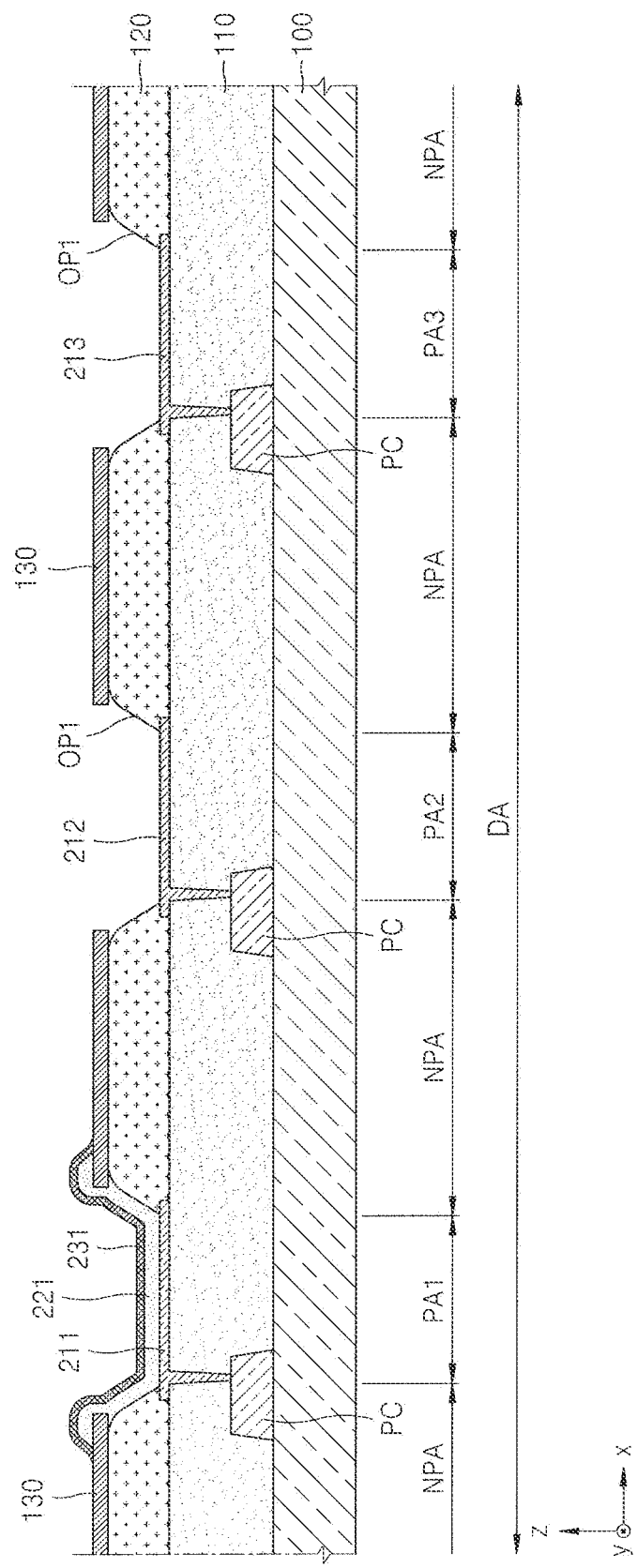

Referring to FIG. 14, the first masking layer 1010 may be removed by a lift-off process. In an embodiment, when the first auxiliary layer 1110 is formed of a fluorine-based material, the first auxiliary layer 1110 may be removed by using a fluorine-based solvent. When the first auxiliary layer 1110 is removed, the first photosensitive pattern layer 1210 on the first auxiliary layer 1110 and material layers stacked on the first photosensitive pattern layer 1210 are also removed. The first intermediate layer 221 and the first counter electrode 231 having island shapes may remain on the first pixel area PA1.

Figure 15:
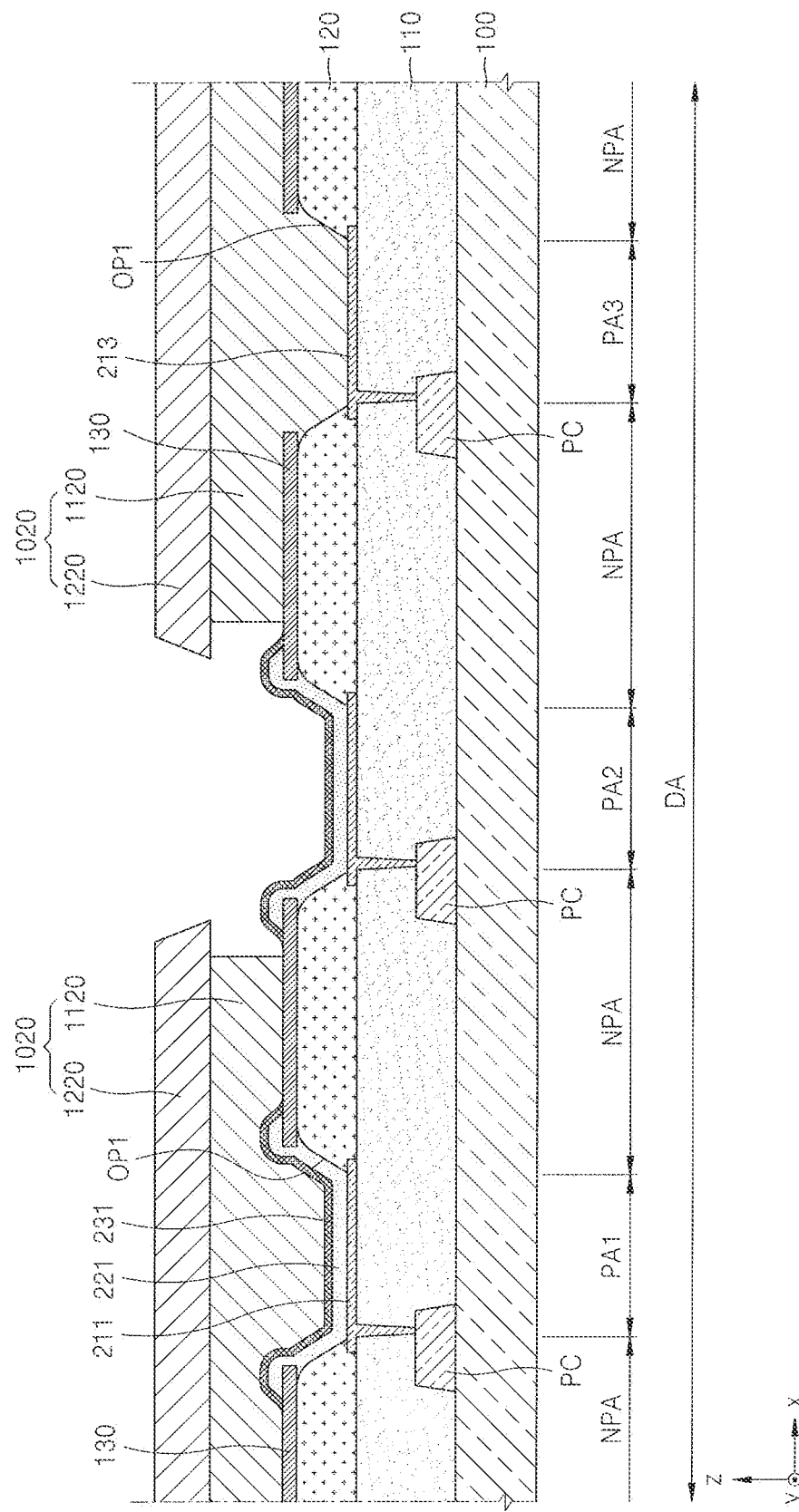

Referring to FIG. 15, a second masking layer 1020 having an open portion corresponding to the second pixel area PA2 may be formed. The second masking layer 1020 may include a second photosensitive pattern layer 1220 and a second auxiliary layer 1120 between the second photosensitive pattern layer 1220 and the pixel-defining layer 120. The second auxiliary layer 1120 and the second photosensitive pattern layer 1220 may by formed by using the same material and the same process as described above with respect to the first auxiliary layer 1110 and the first photosensitive pattern layer 1210.

The second intermediate layer 222 and the second counter electrode 232 may be sequentially formed on the substrate 100 on which the second masking layer 1020 is formed. A passivation layer may be additionally formed over the second counter electrode 232. Materials of the second intermediate layer 222 and the second counter electrode 232 have been described with reference to FIG. 3, and thus a explanation thereof will not be repeated.

The second intermediate layer 222 and the second counter electrode 232 may be formed by thermal evaporation, and the passivation layer may be formed by chemical vapor deposition (CVD).

Deposition materials for forming the second intermediate layer 222, the second counter electrode 232, and the passivation layer may move toward the substrate 100 in a direction perpendicular or oblique to the substrate 100. Accordingly, end portions of the second intermediate layer 222, the second counter electrode 232, and the passivation layer may each have a forward taper shape without contacting the second auxiliary layer 1120.

The end portion of the second counter electrode 232 may extend farther than the end portion of the second intermediate layer 222 and may contact the auxiliary electrode 130 such that the second counter electrode 232 has a width greater than that of the second intermediate layer 222. The second counter electrode 232 may directly contact a top surface of the auxiliary electrode 130 and may be directly connected electrically to the auxiliary electrode 130.

The second masking layer 1020 may be removed by using a lift-off process. For example, the second auxiliary layer 1120 may be removed by using, for example, a fluorine-based solvent. Accordingly, the second photosensitive pattern layer 1220 on the second auxiliary layer 1120, the second intermediate layer 222, the second counter electrode 232, and a second passivation layer 242 may be removed. The second intermediate layer 222, the second counter electrode 232, and the second passivation layer 242 having island shapes may remain on the second pixel area PA2.

Figure 16:
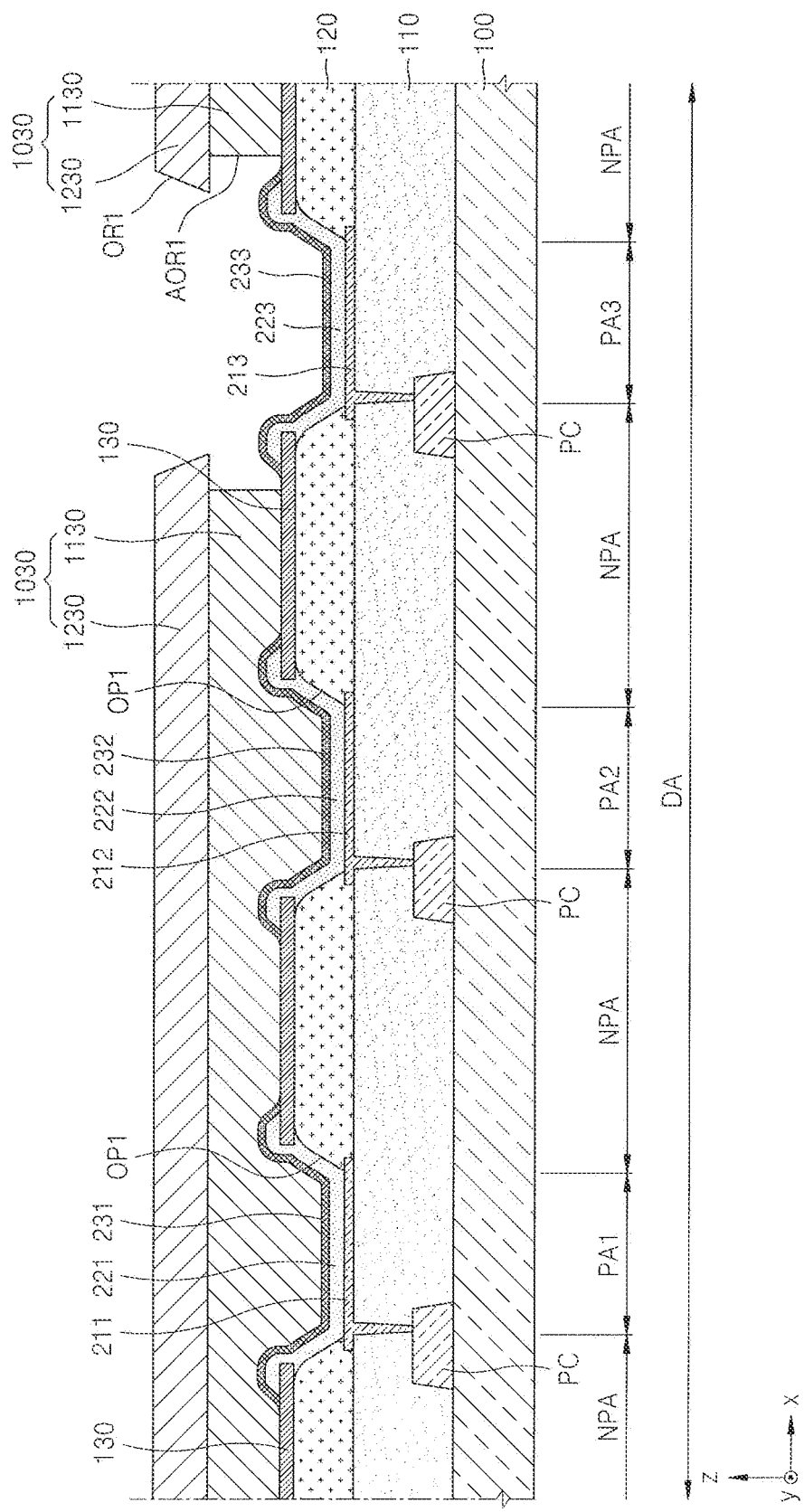

Referring to FIG. 16, a third masking layer 1030 having an open portion corresponding to the third pixel area PA3 may be formed. The third masking layer 1030 may include a third photosensitive pattern layer 1230 and a third auxiliary layer 1130 between the third photosensitive pattern layer 1230 and the pixel-defining layer 120. The third auxiliary layer 1120 and the third photosensitive pattern layer 1220 may be formed by using the same material and the same process as described above with respect to the first auxiliary layer 1110 and the first photosensitive pattern layer 1210.

The third intermediate layer 223 and the third counter electrode 233 may be sequentially formed on the substrate 100 on which the third masking layer 1030 is formed. A passivation layer may be additionally formed over the third counter electrode 233. Materials of the third intermediate layer 223, the third counter electrode 233, and the passivation layer have been described with reference to FIG. 3, and thus a explanation thereof will not be repeated.

The third intermediate layer 223 and the third counter electrode 233 may be formed by using thermal evaporation, and the passivation layer may be formed by using CVD.

Deposition materials for forming the third intermediate layer 223, the third counter electrode 233, and the passivation layer may move toward the substrate 100 in a direction perpendicular or oblique to the substrate 100. Accordingly, end portions of the third intermediate layer 223, the third counter electrode 233, and the passivation layer may each have a forward taper shape without contacting the third auxiliary layer 1130.

The end portion of the third counter electrode 233 may extend farther than the end portion of the third intermediate layer 223 and may contact the auxiliary electrode 130 such that the third counter electrode 233 has a width greater than that of the third intermediate layer 223. The third counter electrode 233 may directly contact a top surface of the auxiliary electrode 130 and may be directly connected electrically to the auxiliary electrode 130.

Figure 17:
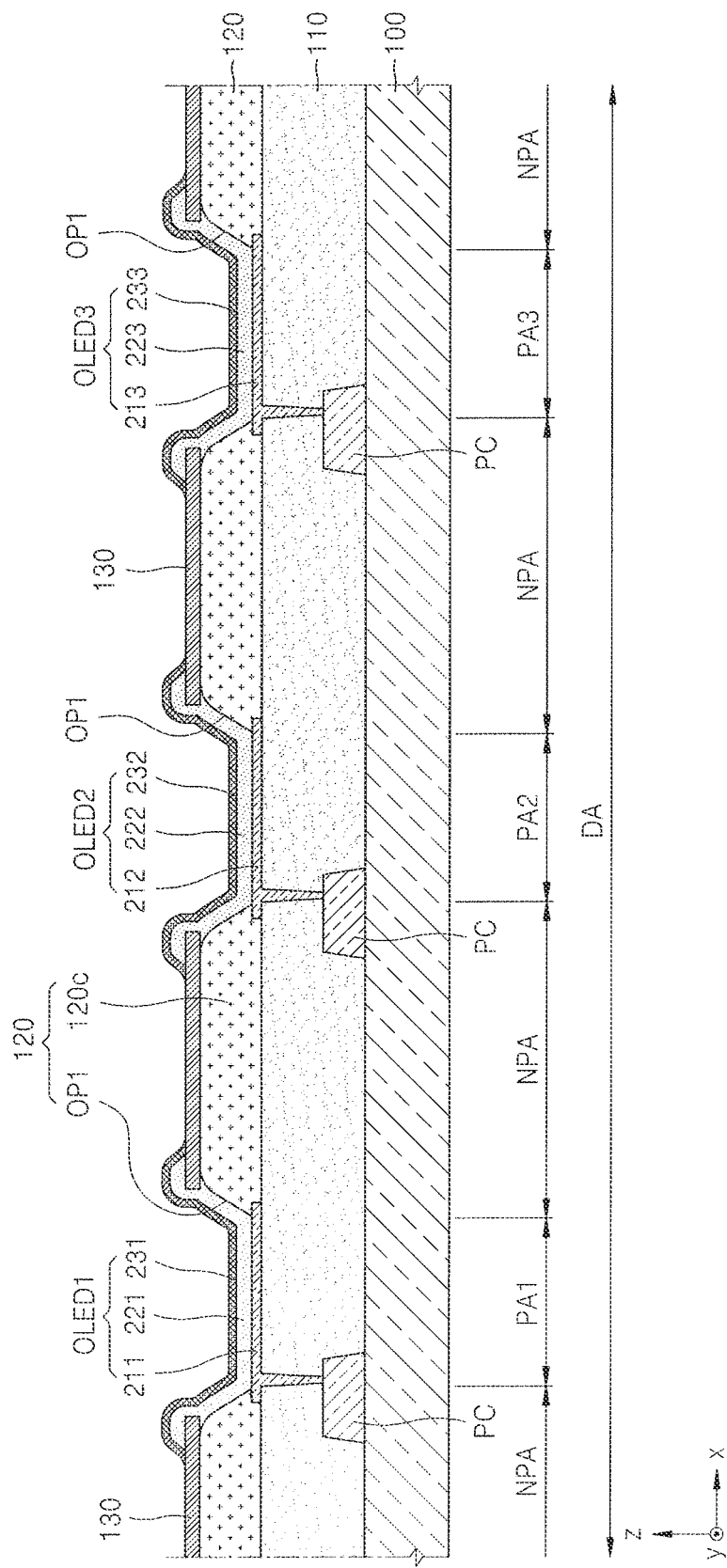

Referring to FIG. 17, the third masking layer 1030 may removed using a lift-off process. For example, the third auxiliary layer 1130 may be removed by using, for example, a fluorine-based solvent. Accordingly, the third photosensitive pattern layer 1230 on the third auxiliary layer 1130 and material layers may be removed. The third intermediate layer 223 and the third counter electrode 233 having island shapes may remain on the third pixel area PA3.

Figure 18:
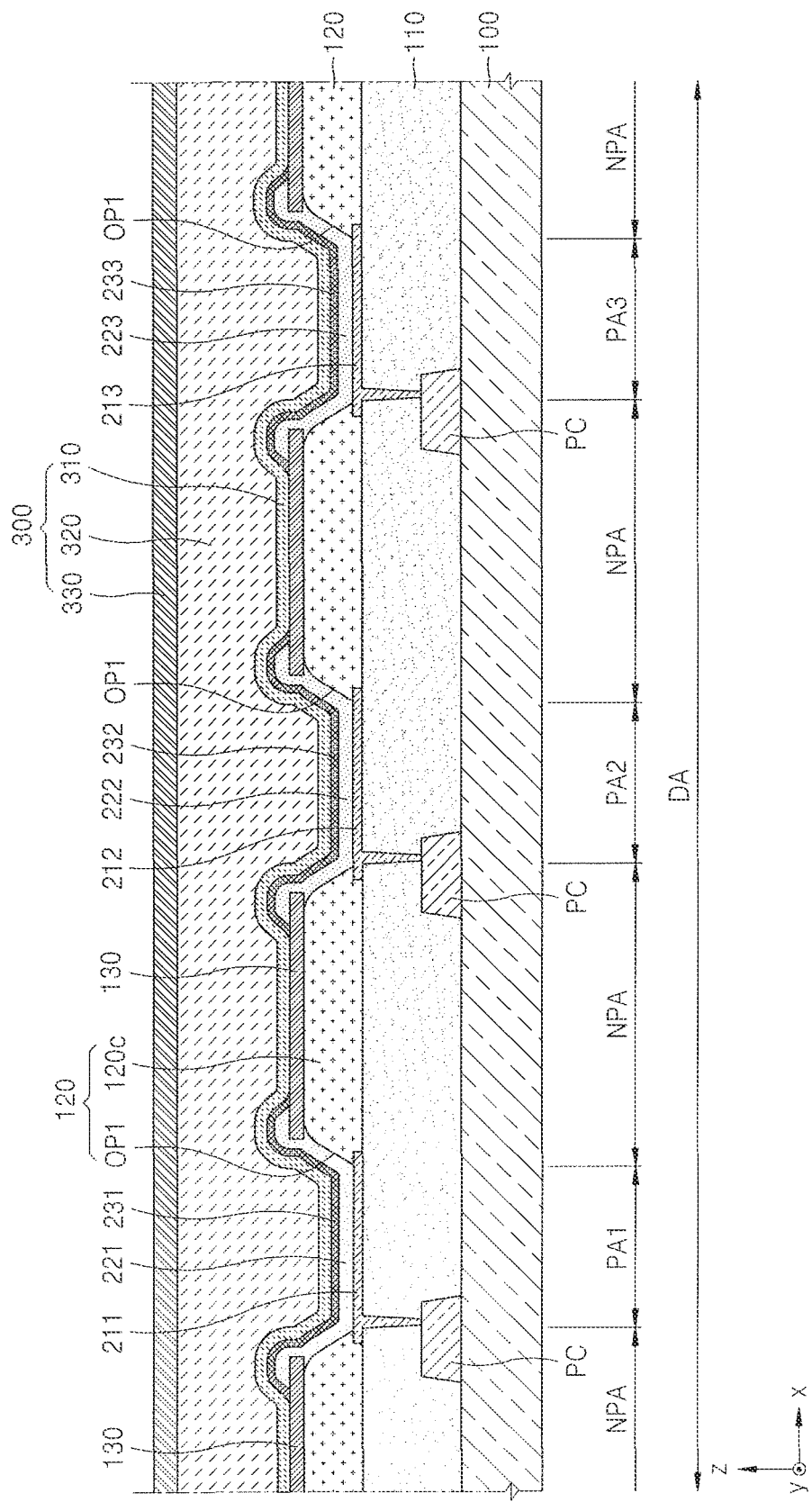
FIG. 18 illustrates a cross-sectional view of an organic light-emitting display apparatus according to another embodiment.

FIG. 18 illustrates a cross-sectional view of an organic light-emitting display apparatus according to another embodiment. In FIG. 18, elements that are the same as those in FIG. 3 are denoted by the same reference numerals, and thus a explanation thereof will not be repeated.

In the present embodiment, in the organic light-emitting display apparatus, a thin-film encapsulation layer 300 that helps to prevent external oxygen and moisture from penetrating into the display area DA by sealing the display area DA may be formed.

The thin-film encapsulation layer 300 may include at least one inorganic film (e.g., first and second inorganic films 310 and 330) and at least one organic film 320. For example, the thin-film encapsulation layer 300 may include the first inorganic film 310, the organic film 320, and the second inorganic film 330 that are sequentially stacked as shown in FIG. 18. In some implementations, the thin-film encapsulation layer 300 may have any of various other configurations.

Each of the first inorganic film 310 and the second inorganic film 330 may include at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and SiON.

The organic film 320 may include at least one material selected from an acrylic resin layer, a methacrylic resin layer, polyisoprene, a vinyl-based resin layer, an epoxy-based resin layer, a urethane-based resin layer, a cellulose-based resin layer, and a perylene-based resin layer.

The thin-film encapsulation layer 300 may formed on the first through third OLEDs OLED1, OLED2, and OLED3 as illustrated in FIG. 18. In some implementations, the organic light-emitting display apparatus may include a sealing substrate instead of the thin-film encapsulation layer 300. The sealing substrate may be adhered to the substrate 100 by using a sealing member such as a sealing glass frit. The sealing substrate may help to prevent external moisture or air from penetrating into the display area DA.

In some implementations, various functional layers such as a polarization layer, a color filter layer, and a touchscreen layer may be further located over the thin-film encapsulation layer 300 or the sealing substrate.

By way of summation and review, when an organic light-emitting display apparatus is manufactured, light of different colors may be emitted from pixel areas. A counter electrode integrally formed over a plurality of pixels and an emission layer of each pixel may be formed by using a deposition mask. As the resolution of an organic light-emitting display apparatus increases, a width of an open slit of a mask used during a deposition process decreases and a reduction of a distribution thereof is desirable. Also, in order to manufacture a high-resolution organic light-emitting display apparatus, it is desirable to reduce or eliminate a shadow effect. Research has been conducted on a deposition process of patterning a sacrificial layer and using the patterned sacrificial layer as a mask.

Embodiments include an organic light-emitting display apparatus for reducing a defect rate of an organic light-emitting device (OLED) and a method of manufacturing the organic light-emitting display apparatus.

As described above, in an organic light-emitting display apparatus according to the one or more embodiments, when a pixel-defining layer has an under-cut structure in which an upper portion of the pixel-defining layer is recessed from an auxiliary electrode, leakage current between a counter electrode and a pixel electrode may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing an organic light-emitting display apparatus, the method comprising:
   providing a substrate on which a plurality of pixel electrodes are formed;
   forming a pixel-defining layer including a cover portion and openings, wherein the cover portion covers an edge of an adjacent pixel electrode from among the plurality of pixel electrodes, and the openings respectively expose a central portion of each of the plurality of pixel electrodes;
   forming an auxiliary electrode such that the auxiliary electrode corresponds to at least a portion of a top surface of the cover portion;
   forming, by etching a side surface of the cover portion, an under-cut structure in which the at least a portion of the top surface of the cover portion is recessed from the auxiliary electrode; and
   forming a first masking layer such that a first pixel electrode from among the plurality of pixel electrodes is exposed, and then forming, on the first pixel electrode, a first intermediate layer and a first counter electrode.

2. The method as claimed in claim 1, wherein forming the auxiliary electrode and forming the under-cut structure are performed using a same photoresist pattern.

3. The method as claimed in claim 1, wherein:
   the pixel-defining layer includes an organic material, and
   etching the side surface of the cover portion is performed by dry etching using an oxygen plasma.

4. The method as claimed in claim 1, wherein:
   the pixel-defining layer includes an inorganic material, and
   etching the side surface of the cover portion is performed by dry etching using a $SF_6$ gas.

5. The method as claimed in claim 1, wherein:
   the first intermediate layer includes an emission layer, a lower functional layer located under the emission layer, and an upper functional layer located over the emission layer, and
   a thickness of the auxiliary electrode is greater than a thickness of the lower functional layer.

6. The method as claimed in claim 1, wherein:
   the first intermediate layer includes an emission layer, a lower functional layer located under the emission layer, and an upper functional layer located over the emission layer,
   at least a portion of the first intermediate layer is located over the auxiliary electrode, and
   at least a portion of the lower functional layer located over the auxiliary electrode is spaced apart from a portion of the lower functional layer located inside the openings.

7. The method as claimed in claim 6, wherein the lower functional layer includes at least one of a hole injection layer and a hole transport layer.

8. The method as claimed in claim 1, wherein an end portion of the first counter electrode extends toward and contacts the auxiliary electrode.

9. The method as claimed in claim 1, further comprising:
   removing the first masking layer by a lift-off process;
   forming a second masking layer such that a second pixel electrode from among the plurality of pixel electrodes is exposed;
   forming, on the second pixel electrode, a second intermediate layer and a second counter electrode;
   removing the second masking layer by a lift-off process;
   forming a third masking layer such that a third pixel electrode from among the plurality of pixel electrodes is exposed; and
   forming, on the third pixel electrode, a third intermediate layer and a third counter electrode.

10. The method as claimed in claim 1, wherein the substrate includes a plurality of thin-film transistors (TFTs) electrically connected to the plurality of pixel electrodes.

* * * * *